US012320028B2

(12) United States Patent
Takshi et al.

(10) Patent No.: US 12,320,028 B2
(45) Date of Patent: *Jun. 3, 2025

(54) ELECTROCHEMICAL THREE-DIMENSIONAL PRINTING AND SOLDERING

(71) Applicant: UNIVERSITY OF SOUTH FLORIDA, Tampa, FL (US)

(72) Inventors: Arash Takshi, Tampa, FL (US); Sabrina Marie Rosa-Ortiz, Tampa, FL (US)

(73) Assignee: UNIVERSITY OF SOUTH FLORIDA, Tampa, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/145,732

(22) Filed: Dec. 22, 2022

(65) Prior Publication Data

US 2023/0129434 A1    Apr. 27, 2023

Related U.S. Application Data

(60) Continuation of application No. 17/568,621, filed on Jan. 4, 2022, now Pat. No. 11,535,947, which is a
(Continued)

(51) Int. Cl.
*C25D 5/08* (2006.01)
*B29C 64/20* (2017.01)
(Continued)

(52) U.S. Cl.
CPC ............... *C25D 5/08* (2013.01); *B29C 64/20* (2017.08); *C25D 1/003* (2013.01); *C25D 3/38* (2013.01);
(Continued)

(58) Field of Classification Search
None
See application file for complete search history.

(56) References Cited

U.S. PATENT DOCUMENTS 3,334,028 A * 8/1967 Polichette ................ C25D 5/08
204/224 R
3,468,785 A    9/1969 Polichette
(Continued)

FOREIGN PATENT DOCUMENTS

CN       106191946 B     10/2018
WO       2005033798 A3    7/2006

OTHER PUBLICATIONS

A Mahmoudzadeh et al., "Photocurrent generation by direct electron transfer using photosynthetic reaction centres," Smart Materials and Structures, 2011, 20(9): 094019, 6 pages.
(Continued)

*Primary Examiner* — Louis J Rufo
(74) *Attorney, Agent, or Firm* — Quarles & Brady LLP

(57) ABSTRACT

A hydrogen evolution assisted electroplating nozzle includes a nozzle tip configured to interface with a portion of a substructure. The nozzle also includes an inner coaxial tube connected to a reservoir containing an electrolyte and an anode, the inner coaxial tube configured to dispense the electrolyte through the nozzle tip onto the portion of the substructure. The nozzle also includes an outer coaxial tube encompassing the inner coaxial tube, the outer coaxial tube configured to extract the electrolyte from the portion of the substructure. The nozzle also includes at least one contact pin configured to make electrical contact with a conductive track on the substrate.

14 Claims, 15 Drawing Sheets

Related U.S. Application Data division of application No. 16/032,901, filed on Jul. 11, 2018, now Pat. No. 11,214,884.

(60) Provisional application No. 62/530,991, filed on Jul. 11, 2017.

(51) Int. Cl.

| | | |
|---|---|---|
| *B29C 64/30* | (2017.01) | |
| *B33Y 10/00* | (2015.01) | |
| *C25D 1/00* | (2006.01) | |
| *C25D 3/38* | (2006.01) | |
| *C25D 5/00* | (2006.01) | |
| *C25D 5/02* | (2006.01) | |
| *C25D 5/04* | (2006.01) | |
| *C25D 5/54* | (2006.01) | |
| *C25D 7/00* | (2006.01) | |
| *C25D 7/04* | (2006.01) | |
| *C25D 17/00* | (2006.01) | |
| *C25D 17/06* | (2006.01) | |
| *C25D 17/10* | (2006.01) | |
| *C25D 17/12* | (2006.01) | |
| *C25D 21/12* | (2006.01) | |
| *H05K 1/18* | (2006.01) | |
| *H05K 3/24* | (2006.01) | |
| *H05K 3/32* | (2006.01) | |
| *B33Y 70/10* | (2020.01) | |
| *B33Y 80/00* | (2015.01) | |
| *H05K 1/09* | (2006.01) | |

(52) U.S. Cl.
CPC .............. *C25D 5/003* (2013.01); *C25D 5/02* (2013.01); *C25D 5/026* (2013.01); *C25D 5/04* (2013.01); *C25D 5/54* (2013.01); *C25D 7/00* (2013.01); *C25D 7/04* (2013.01); *C25D 17/005* (2013.01); *C25D 17/06* (2013.01); *C25D 17/10* (2013.01); *C25D 17/12* (2013.01); *C25D 21/12* (2013.01); *H05K 3/241* (2013.01); *H05K 3/246* (2013.01); *H05K 3/328* (2013.01); *B29C 64/30* (2017.08); *B33Y 10/00* (2014.12); *B33Y 70/10* (2020.01); *B33Y 80/00* (2014.12); *H05K 1/097* (2013.01); *H05K 1/181* (2013.01); *H05K 1/183* (2013.01); *H05K 2201/0323* (2013.01); *H05K 2203/013* (2013.01)

(56) References Cited

U.S. PATENT DOCUMENTS

| | | | |
|---|---|---|---|
| 5,223,110 A * | 6/1993 | Nolan | .................... H05K 3/241 |
| | | | 204/224 R |
| 5,468,918 A | 11/1995 | Kanno et al. | |
| 5,830,334 A | 11/1998 | Kobayashi | |
| 6,303,401 B2 | 10/2001 | Nichterwitz | |
| 7,563,348 B2 | 7/2009 | Dordi | |
| 9,184,308 B1 | 11/2015 | Wu et al. | |
| 9,443,662 B2 | 9/2016 | Ladanov et al. | |
| 2003/0000840 A1 | 1/2003 | Kimura | |
| 2006/0201817 A1 | 9/2006 | Guggemos | |
| 2008/0222876 A1* | 9/2008 | Weber | .................... H05K 3/303 |
| | | | 29/592.1 |
| 2011/0155563 A1 | 6/2011 | Ravkin | |

OTHER PUBLICATIONS

Abdelnola et al., "Photoelectrochemical Cell of Hybrid Regioregular Poly(3-Hexylthiophene-2, 5-diyl) and Molybdenum Disulfide Film," Surface Review and Letters, 2016, 1750026.

Ahmadloo et al., "A novel integrated dielectric-and-conductive ink 3D printing technique for fabrication of microwave devices," IEEE Microwawe Symposium Digest (IMS), 2013, pp. 1-3.

Ahmed et al., "A Thin Film Approach for SiC-Derived Graphene as an On-Chip Electrode for Supercapacitors," Nanotechnology, 2015, vol. 26, 434005, 11 pages.

Ambrosi et al., "3D-printing technologies for electrochemical applications," Chem. Soc. Rev., 2016, 45, 2740-2755.

Berman, "3-D printing: The new industrial revolution," Business horizons, 2012, 55(2): 155-162.

Boparai et al., "Development of rapid tooling using fused deposition modeling: a review," Rapid Prototyping Journal, 2016, 22(2): 281-299.

Cascio et al., "Investigation of a polythiophene interface using photoemission spectroscopy in combination with electrospray thin-film deposition," Applied Physics Letters, 2006, 88(6): 062104, 3 pages.

Chang et al., "Property measurement and processing parameter optimization for polylactide micro structure fabrication by thermal imprint," Japanese Journal of Applied Physics, 2013, 52(6S): 06GJ09, 7 pages.

Chen et al., "Investigation of overpotential and seed thickness on damascene copper electroplating," Surface and Coatings Technology, 2006, 200(10): 3112-3116.

Clay, "Electrically conductive thermoplastic elastomers in application to additive manufacturing," Doctoral Dissertation Southern Methodist University, 2014, 91 pages.

Colasante et al., "Current Trends in 3D Printing, Bioprosthetics, and Tissue Engineering in Plastic and Reconstructive Surgery," Current Surgery Reports, 2016, 4(3): 1-14.

Cummins et al., "Inkjet printing of conductive materials: a review," Circuit World, 2012, 38(4): 193-213.

Dam et al., "Photoelectron spectroscopic investigation of in-vacuum-prepared luminescent polymer thin films directly from solution," Journal of Applied Physics, 2005, 97(2): 024909, 7 pages.

Digital ammeter definition. available: https ://analyseameter.com/2015/09/digital-multi meter-dmm-working-principle. html#:-:text=A% 20digital%20ammeter%20uses%20a,to%20read% 20the%20input%20current. accessed Sep. 28, 2020 (Year: 2020).

Ebrahimi et al., "Electrochemical Detection of Piezoelectric Effect from Misaligned Zinc Oxide Na now ires Grown on a Flexible Electrode," Electrochimica Acta, 2014, vol. 134, 435-441.

Equbal et al., "Investigations on metallization in FDM build ABS part using electroless deposition method," Journal of Manufacturing Processes, 2015, 19, 22-31.

Espalin et al., "3D Printing multifunctionality: structures with electronics," The International Journal of Advanced Manufacturing Technology, 2014, 72(5-8): 963-978.

Figueroa et al., "Antibody immobilization using pneumatic spray: Comparison with the avid in-biotin bridge immobilization method," Journal of Immunological Methods, 2012, 386(1-2):1-9.

Gallaway et al., "Acceleration kinetics of PEG, PPG, and a triblock copolymer by SPS during copper electroplating," Journal of The Electrochemical Society, 2009, 156(4): D146-D154.

Grimmelsmann et al., "Mechanical and Electrical Contacting of Electronic Components on Textiles by 3D Printing," Procedia Technology, 2016, 26, 66-71.

Guojun et al., "Study on Friction and Wear Properties of Carbon Fiber Felt Copper Composites," Acta Materiae Compositae Sinica, 1997, 2, 1-7.

Gutmann et al., "Electronic structure of indium tin oxide/nanocrystalline TiO2 interfaces as used in dye-sensitized solar cell devices," Journal of Applied Physics, 2011. 109, 113719, 10 pages.

Gutmann et al., "Work Function Measurements on Nano-Crystalline Zinc Oxide Surfaces," Journal of Applied Physics, 2012, 111(12): 123710, 7 pages.

Ho et al., "3D printed microfluidics for biological applications," Lab on a Chip, 2015, 15(18): 3627-3637.

Hofmann, "3D printing gets a boost and opportunities with polymer materials," ACS Macro Letters, 2014, 3(4): 382-386.

Hu et al., "Fabrication of superhydrophobic surfaces on copper substrates via brush plating technique," Advanced Materials Research, 2014, 834, pp. 662-669.

(56) References Cited

OTHER PUBLICATIONS

Jo et al., "Formulation of Conductive Filament Composited of Thermoplastic with Carbon Black for a Simple 3D Printing Electrical Device," Journal of Nanoscience and Nanotechnology, 2016, 16(8): 8415-8418.

Jo et al., "Synthesis and characterization of low temperature Sn nanoparticles for the fabrication of highly conductive ink," Nanotechnology, 2011, 22(22): 225701, 8 pages.

Kalsoom et al., "Recent developments in 3D printable composite materials," RSC Advances, 2016, 6(65): 60355-60371.

Kantaros et al., "Fiber Bragg grating based investigation of residual strains in ABS parts fabricated by fused deposition modeling process," Materials & Design, 2013, 50, 44-50.

Krassentein, "Engineer Creates a Unique 3D Metal Printer for Just $2—Prints in Gold, Platinum, Iron & More," 3DPrint.com, <https://3dprint.com/47065/argentinian-3d-metal-printer/> Feb. 26, 2015, Kumar et al., "Effects of Electroplating on the Mechanical Properties of FDM-PLA Parts," i-Manager's Journal on Future Engineering and Technology, 2015, 10(3): 28-36.

Ladanov et al., "Effects of the physical properties of atomic layer deposition grown seeding layers on the preparation of ZnO nanowires," Journal of Physics and Chemistry of Solids, 2013, 74(11): 1578-1588.

Ladanov et al., "Microfluidic hydrothermal growth of ZnO nanowires over high aspect ratio microstructures," Nanotechnology, 2013, 24(37): 375301, 9 pages.

Lee et al., "Inkjet printing of nanosized silver colloids," Nanotechnology, 2005, 16(10): 2436-2441.

Leigh et al., "A simple, low-cost conductive composite material for 3D printing of electronic sensors," Plos one, 2012, 7(11): e49365, 7 pages.

Li et al., "Conductive copper and nickel lines via reactive inkjet printing," Journal of Materials Chemistry, 2009, 19(22): 3719-3724.

Li et al., "The impact of inverse photoemission spectroscopy measurements on regioregular poly(3-hexylthiophene) films," Applied Physics Letters, 2014, 104(2): 021606, 5 pages.

Liyakath et al., "Multilayer stretchable conductors on polymer substrates for conformal and reconfigurable antennas," IEEE Antennas and Wireless Propagation Letters, 2013, 12, 603-606.

Lou et al., "Electroplating," Encyclopedia of Chemical Processing, 2006, 1, 839-848.

Lyon et al., "Electronic structure of the indium tin oxide/nanocrystalline anatase (TiO2)/ruthenium-dye interfaces in dye-sensitized solar cells," Journal of Applied Physics, 2008, 104(7): 073714-073719.

MacDonald et al., "Multiprocess 3D printing for increasing component functionality," Science, 2016, 353(6307): aaf2093, 10 pages.

Madden et al., "Fabrication by electrodeposition: building 3D structures and polymer actuators," Sixth International Symposium on Micro Machine and Human Science, 1995, pp. 77-81.

Madden et al., "Three-dimensional microfabrication by localized electrochemical deposition," Journal of microelectromechanical systems, 1996, 5(1): 24-32.

Magulick et al., "Investigation of Adenine, Uracil, and Ribose Phosphate Thin Films Prepared by Electrospray In-Vacuum Deposition Using Photoemission Spectroscopy," Thin Solid Films, 2008, 516(9): 2396-2400.

Magulick et al., "Polarization lowering of charge injection barriers at a ribonucleic acid/Au interface," Journal of Applied Physics, 2008, 104(12): 123701, 6 pages.

Merrian Webster Definition for ammeter (Year: 2020).

Mireles et al., "Development of a fused deposition modeling system for low melting temperature metal alloys," Journal of Electronic Packaging, 2013, 135(1): 011008, 6 pages.

Miura et al., "Advanced copper electroplating for application of electronics," Surface and Coatings Technology, 2003, 169, 91-95.

Yaghoubi et al., "The Role of Gold-Adsorbed Photosynthetic Reaction Centers and Redox Mediators in the Charge Transfer and Photocurrent Generation in a Bio-Photoelectrochemical Cell," The Journal of Physical Chemistry C, 2012, 116(47): 24868-24877.

Yaghoubi et al., "Toward a Visible Light-Driven Photocatalyst: The Effect of Midgap-States-Induced Energy Gap of Undoped TiO2 Nanoparticles," ACS Catalysis, 2014, 5(1): 327-335.

Yi et al., "Orbital alignment at poly[2-methoxy-5-(2'-ethylhexyloxy)-p-phenylene vinylene interfaces," Journal of Applied Physics, 2007, 102(2): 023710, 7 pages.

Yoo et al., "Field-Dependent Growth Patterns of Metals Electroplated in Nanoporous Alumina Membranes," Advanced materials, 2004, 16(13): 1097-1101.

Zhai et al., "Additive manufacturing: making imagination the major limitation," JOM, 2014, 66(5): 808-816.

Zhang et al., "Fabrication of highly conductive graphene flexible circuits by 3D printing," Synthetic Metals, 2016, 217, 79-86.

Morales-Guio et al., "Hydrogen evolution from a copper (I) oxide photocathode coated with an amorphous molybdenum sulphide catalyst," Nature communications, 2014, 5, 1-7.

Nikolic et al., "Formation of dish-like holes and a channel structure in electrodeposition of copper under hydrogen co-deposition," Electrochimica Acta, 2007, 52(28): 8096-8104.

Yaghoubi et al., "Large Photocurrent Response and External Quantum Efficiency in Biophotoelectrochemical Cells Incorporating Reaction Center Plus Light Harvesting Complexes," Biomacromolecules, 2015, 16(4): 1112-1118.

Nikolic et al., "The effect of hydrogen codeposition on the morphology of copper electrodeposits. I. The concept of effective overpotential," Journal of Electroanalytical Chemistry, 2006, 588(1): 88-98.

Nikolic et al., "The effect of hydrogen co-deposition on the morphology of copper electrodeposits. II. Correlation between the properties of electrolytic solutions and the quantity of evolved hydrogen," Journal of Electroanalytical Chemistry, 2008, 621 (1): 13-21.

Park et al., "Direct writing of copper conductive patterns by ink-jet printing," Thin Solid Films, 2007, 515(19): 7706-7711.

Park, "Design of 3D-Printable Conductive Composites for 3D-Printed Battery," Doctoral Dissertation, Applied Sciences: School of Mechatronic Systems Engineering, Samon Fraiser University, 2016, 81 pages.

Perelaer et al., "Ink-jet printing and microwave sintering of conductive silver tracks," Advanced materials, 2006, 18 (16): 2101-2104.

Postiglione et al., "Conductive 3D microstructures by direct 3D printing of polymer/carbon nanotube nanocomposites via liquid deposition modeling," Composites Part A: Applied Science and Manufacturing, 2015, 76, 110-114.

Rahimi et al., "Energy storage capability of the dye sensitized solar cells via utilization of highly porous carbon electrodes," International Society for Optics and Photonics, 2016, 99370T-99370T, 8 pages.

Rahimi et al., "Photoelectrochemical reaction in conducting polymers for solar energy harvesting and charge storage," International Society for Optics and Photonics, 2016, 99370U-99370U, 8 pages.

Raja, "The systematic development of Direct Write (DW) technology for the fabrication of printed antennas for the aerospace and defence industry," Doctoral Dissertation, Mechanical, Electrical and Manufacturing Engineering, Loughborough University, 2014, 287 pages.

Ram et al., "A new chromic (TouchChromic) thin film." Acta Materialia, 2016, 121, 325-330.

Ready et al., "3D Printed Electronics," NIP & Digital Fabrication Conference, 2013, pp. 9-12.

Rengier et al., "3D printing based on imaging data: review of medical applications," International journal of computer assisted radiology and surgery, 2010, 5(4): 335-341.

Rojas-Nastrucci et al., "Propagation Characteristics and Modeling of Meshed Ground Coplanar Waveguide," IEEE Transactions on Microwave Theory and Techniques, 2016, 64(11): 3460-3468.

Rosa-Ortiz et al., "Low Temperature Soldering Surface-Mount Electronic Components With Hydrogen Assisted Cooper Electroplating," Poster presented at MRS Advances Fall Meeting (Nov. 26, 2017-Dec. 1, 2017).

(56) References Cited

OTHER PUBLICATIONS

Rymansaib et al., "All-Polystyrene 3D-Printed Electrochemical Device with Embedded Carbon Nanofiber-Graphite-Polystyrene Composite Conductor," Electroanalysis, 2016, 28, 1517-1523.

Santhanakrishna et al., "Photoelectric Memory Effect in an Organic Bulk Heterojunction Device," The Journal of Physical Chemistry C, 2015, 119(30): 17253-17259.

Schaefer et al., "Electronic structure investigation of atomic layer deposition ruthenium (oxide) thin films using photoemission spectroscopy," Journal of Applied Physics, 2015, 118(6): 065306, 7 pages.

Schaefer et al., "Investigation of the dipole formation and growth behavior at In2O3I TiO2 heterojunctions using photoemission spectroscopy and atomic force microscopy," Journal of Applied Physics, 2016, 119(6): 065305, 10 pages.

Schaefer et al., "Synthesis and in vacuo deposition of iron xide nanoparticles by microplasma-assisted decomposition of ferrocene," Journal of Applied Physics, 2014, 116(13): 133703, 6 pages.

Schlaf et al., "X-ray absorption measurements on an ultrasonic spray aerosol," Journal of Synchrotron Radiation, 2012, 19(1): 126-128.

Stanton et al., "Applications of three-dimensional (3D) printing for microswimmers and bio-hybrid robotics," Lab on a Chip, 2015, 15(7): 1634-1637.

Sun et al., "An overview of 3D printing technologies for food fabrication," Food and Bioprocess Technology, 2015, 8 (8): 1605-1615.

Takshi et al., "A Photovoltaic Device Using an Electrolyte Containing Photosynthetic Reaction Centers," Energies, 2010, 3(11): 1721-1727.

Takshi et al., "Application of Wide Band Gap Semiconductors to Increase Photocurrent in a Protein Based Photovoltaic Device," MRS Proceedings, Fall meeting, 2012, 1414, mrsf11-1414-hh1407-1401, 6 pages.

Takshi et al., "Depletion width measurement in an organic Schottky contact using a metal-semiconductor field-effect transistor," Applied Physics Letters, 2007, 91 (8): 083513, 3 pages.

Takshi et al., "Diffusion model for charge transfer from a photosynthetic reaction center to an electrode in a photovoltaic device," Electrochimica Acta, 2009, 54(14): 3806-3811.

Takshi et al., "Multilayer Stretchable Conductors with a Large Tensile Strength," Journal of Elastomers and Plastics, 2010, 42(4): 365-373.

Takshi et al., "Perovskite based photosensor for electrochemical studies," International Society for Optics and Photonics, 2016, 99440R, 8 pages.

Takshi et al., "Photoactive Supercapacitors for Solar Energy Harvesting and Storage," Journal of Power Sources, 2015, 275, 621-626.

Takshi et al., "Simulation of a dual gate organic transistor compatible with printing methods," Solid-State Electronics, 2008, 52(1): 107-114.

Takshi et al., "Simulation of a Low-Voltage Organic Transistor Compatible With Printing Methods," IEEE Transactions on Electron Devices, 2008, 55(1): 276-282.

Takshi et al., "Study the effect of distribution of density of states on the depleti on width of organic Schottky contacts," Solid-State Electronics, 2008, 52, 1717-1721.

Takshi et al., "Study the effect of distribution of density of states on the subthreshold characteristics of an organic field-effect transistor (OFET)," J Comput Electron, 2011, 10(1-2): 154-162.

Takshi, "Organic Metal-Semiconductor Field-Effect Transistors (OMESFETs)," Doctoral dissertation, Electrical and Computer Engineering, University of British Columbia (UBC), 2007, 178 pages.

Tevi et al., "Application of poly (p-phenylene oxide) as blocking layer to reduce self-discharge in supercapacitors," Journal of Power Sources, 2013, 241, 589-596.

Tevi et al., "Effect of Triton X-100 on the Double Layer Capacitance and Conductivity of Poly(3,4-ethylenedioxythiophene): Poly (styrenesulfonate) (PEDOT: PSS) Films," Synthetic Metals, 2014, 191, 59-65.

Tevi et al., "Modeling and simulation study of the self-discharge in supercapacitors in presence of a blocking layer," Journal of Power Sources, 2015, 273, 857-862.

Tridas et al., "Enhanced simulation of an RF ion funnel including gas turbulence," Journal of Mass Spectrometry, 2015 50(1): 206-211.

Wang et al., "3D printing of polymer matrix composites: A review and prospective," Composites Part B: Engineering, 2017, 110, 442-458.

Wang et al., "Determination of the charge neutrality level (CNL) of P3HT," Journal of Applied Physics, 2013, (138), 054705, 10 pages.

Wang et al., "Mechanisms and influences of electro-brush plating micro-force on coatings performances," Journal of Materials Research, 2016, 31(15): 2337-2346.

Wei et al., "3D printable graphene composite," Scientific reports, 2015, 5, 11181, 7 pages.

Wolak et al., "Electronic Structure of Self-Assembled Peptide Nucleic Acid Thin Films," The Journal of Physical Chemistry C, 2011, 115(34): 17123-17135.

Yaghoubi et al., "Applications of ZnO Nanowires as Electrode Materials in Photosynthetic Bio-Photoelectrochemical Cells," Proceedings MRS 2015 Spring meeting, San Francisco, 2015, 1772, mrss15-2132583.

Yaghoubi et al., "Free-floating reaction centers (RCs) versus attached monolayer of RCs in bio-photovoltaic devices," MRS Proceedings, Fall Meeting, 2012, 1414, mrsf11-1414-hh1407-1403, 6 pages.

Yaghoubi et al., "Hybrid Wiring of the Rhodobacter Sphaeroides Reaction Center for Applications in Bio-Photoelectrochemical Solar Cells," Journal of Physical Chemistry C, 2014, vol. 118, 23509-23518.

* cited by examiner

ELECTROCHEMICAL THREE-DIMENSIONAL PRINTING AND SOLDERING

CROSS-REFERENCE TO RELATED APPLICATIONS

This is a continuation of U.S. patent application Ser. No. 17/568,621, filed Jan. 4, 2022, which is a divisional of U.S. patent application Ser. No. 16/032,901, filed Jul. 11, 2018, now U.S. Pat. No. 11,214,884, which claims priority to, and the benefit of the filing date of, U.S. Provisional Patent Application No. 62/530,991, filed on Jul. 11, 2017. The contents of each of the preceding patent applications is hereby incorporated herein by reference.

STATEMENT REGARDING FEDERALLY SPONSORED RESEARCH

This invention was made with government support 1400017 and 1612347 awarded by the National Science Foundation. The government has certain rights in the invention.

BACKGROUND OF THE INVENTION

Despite advancements in three-dimensional (3D) printing technology in the recent years, prototyping electronic circuits with a 3D printing method is still challenging. The existing methods for patterning conductive materials in a 3D printed structure are either not suitable for sensitive electronic circuits or too expensive. Additionally, the conventional soldering method is not practical due to the low melting point of the plastic substrates. Hence, soldering electronic components on a 3D printed circuit board may damage the structure.

SUMMARY OF THE INVENTION

Embodiments described herein focus on a novel method for rapid and localized electrochemical copper deposition in 3D printed structures. The method described herein, called hydrogen evolution assisted (HEA) electroplating, has a dramatically enhanced deposition rate compared to conventional electroplating methods. The method described herein opens new venues for the direct integration of 3D printed electronics into larger 3D printed structures. HEA may be used for both printing copper tracks on 3D printed structures and soldering surface mount electronic devices (SMD) to such tracks.

Accordingly, embodiments described herein relate to an electrochemical 3D printing method for low-cost metal printing on conductive or non-conductive substrates. The method may print metals at room temperature to solder electronic components to conductive tracks on a 3D printed workpiece. Additionally, the method may promote the application of integrated electronic circuits in 3D printed structures. Accordingly, embodiments described herein relate electrochemical three dimensional printing and soldering. For example, one embodiment provides a hydrogen evolution assisted electroplating nozzle. The nozzle includes a nozzle tip configured to interface with a portion of a substructure. The nozzle also includes an inner coaxial tube connected to a reservoir containing an electrolyte and an anode, the inner coaxial tube configured to dispense the electrolyte through the nozzle tip onto the portion of the substructure. The nozzle also includes an outer coaxial tube encompassing the inner coaxial tube, the outer coaxial tube configured to extract the electrolyte from the portion of the substructure. The nozzle also includes at least one contact pin configured to make electrical contact with a conductive track on the substrate.

Another embodiment provides a method of localized electroplating using a hydrogen evolution assisted electroplating nozzle. The method includes printing a conductive track on a substructure. The method also includes positioning a tip of the hydrogen evolution assisted electroplating nozzle at a predetermined distance above the substructure, wherein the predetermined distance ensures at least one contact pin of the hydrogen evolution assisted electroplating nozzle makes electrical contact with the conductive track. The method also includes applying, with the hydrogen evolution assisted electroplating nozzle, a predetermined voltage to grow a metal on the conductive track. The method also includes moving the hydrogen evolution assisted electroplating nozzle along the conductive track to metallize the conductive track.

Another embodiment provides a method of low-temperature soldering using a hydrogen evolution assisted electroplating nozzle. The method includes printing a conductive track on a substructure. The method also includes placing a surface mount electronic device (SMD) having a terminal on the substructure. The method also include positioning a tip of the hydrogen evolution assisted electroplating nozzle at a predetermined distance above the substructure, wherein the predetermined distance ensures a contact pin of the hydrogen evolution assisted electroplating nozzle makes electrical contact with the conductive track. The method also includes applying, with the hydrogen evolution assisted electroplating nozzle, a predetermined voltage to grow a metal between the conductive track and the terminal of the SMD.

Other aspects of various embodiments will become apparent by consideration of the detailed description and accompanying drawings.

DETAILED DESCRIPTION

Figure 1:
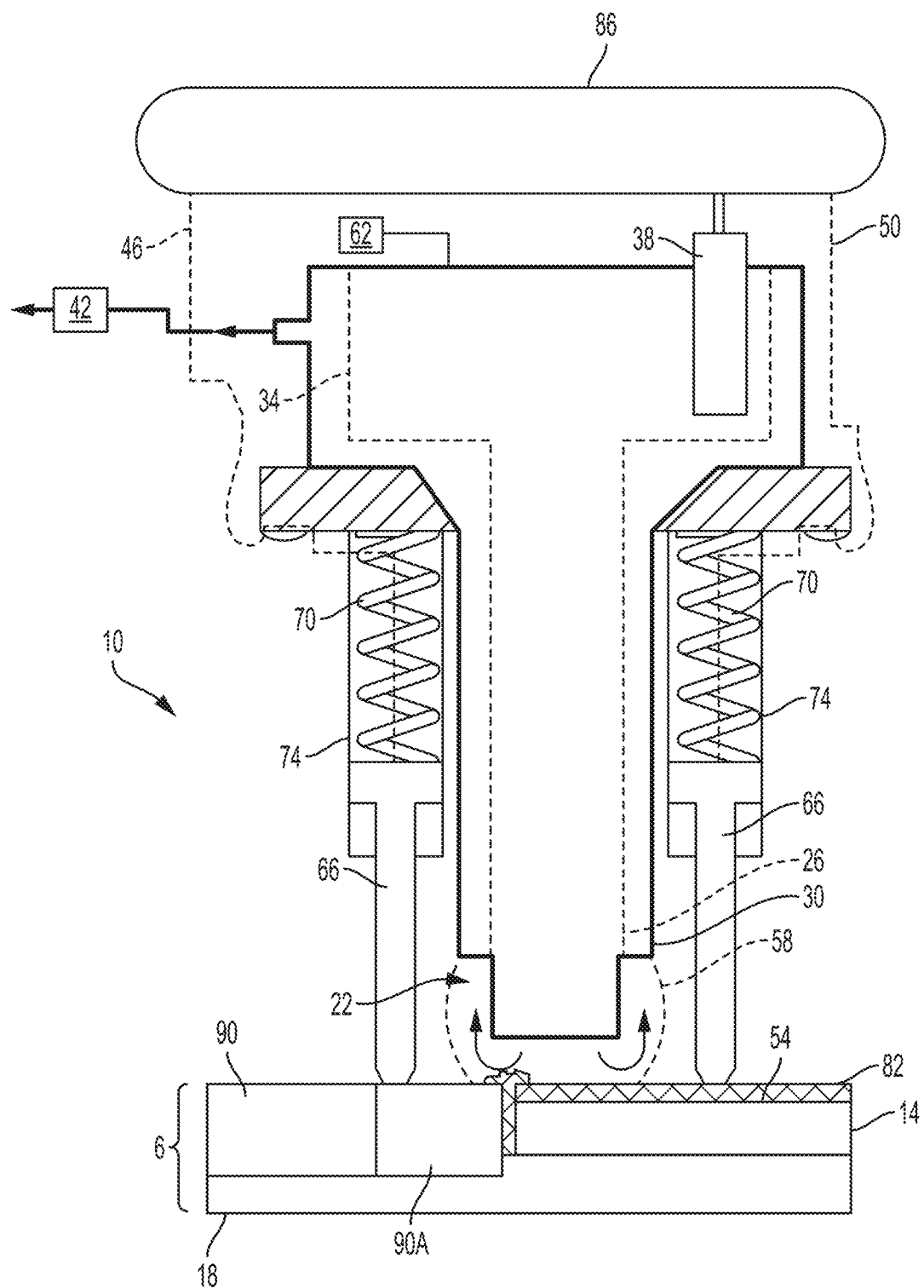
FIG. 1 schematically illustrates a hydrogen evolution assisted (HEA) copper electroplating nozzle for metallization of carbon filament printed tracks and low temperature soldering of surface mount electronic device (SDM) components.

One or more embodiments are described and illustrated in the following description and accompanying drawings. These embodiments are not limited to the specific details provided herein and may be modified in various ways. Furthermore, other embodiments may exist that are not described herein. Also, the functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way, but may also be configured in ways that are not listed. Furthermore, some embodiments described herein may include one or more electronic processors configured to perform the described functionality by executing instructions stored in non-transitory, computer-readable medium. Similarly, embodiments described herein may be implemented as non-transitory, computer-readable medium storing instructions executable by one or more electronic processors to perform the described functionality.

In addition, the phraseology and terminology used herein is for the purpose of description and should not be regarded as limiting. For example, the use of "including," "containing," "comprising," "having," and variations thereof herein is meant to encompass the items listed thereafter and equivalents thereof as well as additional items. The terms "connected" and "coupled" are used broadly and encompass both direct and indirect connecting and coupling. Further, "connected" and "coupled" are not restricted to physical or mechanical connections or couplings and can include electrical connections or couplings, whether direct or indirect. In addition, electronic communications and notifications may be performed using wired connections, wireless connections, or a combination thereof and may be transmitted directly or through one or more intermediary devices over various types of networks, communication channels, and connections. Moreover, relational terms such as first and second, top and bottom, and the like may be used herein solely to distinguish one entity or action from another entity or action without necessarily requiring or implying any actual such relationship or order between such entities or actions.

Overview

One objective of the embodiments described herein is to expand the field of additive manufacturing with a focus on enabling the printing of hybrid three-dimensional (3D) structures with integrated metal structures. The integration of electronic circuits is a primary application for the embodiments described herein. The proposed embodiments focus on the integration of a novel rapid electroplating technique (hydrogen evolution assisted (HEA) electroplating) with standard 3D printing platforms currently in use. The HEA technology provides advancement in the way metals may be integrated with low melting temperature plastics, such as used in current fused deposition modeling (FDM) printers. The HEA technology does not require elevated temperatures while the HEA growth mode results in a dramatically increased deposition rate compared to conventional electroplating methodology.

The preliminary experiment demonstrates that HEA not only grows copper laterally with a speed of 110 µm/s, but also has the capability to bridge 1 mm wide gaps between electronic component terminals and circuit traces. This opens up the possibility for direct integration of standard electronic components into a 3D printed structure and making solder-like interconnections. The test structures demonstrate that (suitably low) contact resistance values of 3.2Ω may be achieved. Further development of embodiments of the invention involves studying the HEA electroplating method for rapid copper printing on 3D printed carbon based structures, optimizing the performance of the HEA electroplating method, investigating the application of the HEA electroplating method to making interconnections across gaps (soldering), designing an HEA print head that may be integrated with conventional FDM printers, and modeling and simulating the HEA electroplating process in confined spaces to gain insight into the laterally resolved deposition process. This further development provides an HEA deposition head that may be added to existing FDM platforms.

Accordingly, embodiments described herein relate to a method of rapid and localized electrochemical metal (such as copper) deposition on various substrates such as three-dimensional (3D) printed structures, flexible plastics, rubbers, fabrics, and the like. While the electrochemical growth rate in the conventional electroplating method is relatively slow, the HEA electroplating method described herein may be used for both printing metal tracks and soldering surface mount electronic devices (SMD). Particularly, the HEA electroplating method may be employed in a nozzle structure of a 3D printer to feature integration of electronic circuits in 3D designed structures.

Introduction. In recent years 3D printing techniques increasingly entered many fields in manufacturing, medicine, and other advanced technology areas (Rengier, F., Mehndiratta, A., von Tengg-Kobligk, H., Zechmann, C. M., Unterhinninghofen, R., Kauczor, H.-U., and Giesel, F. L.: '3D printing based on imaging data: review of medical applications', International journal of computer assisted radiology and surgery, 2010, 5, (4), pp. 335-341; Colasante, C., Sanford, Z., Garfein, E., and Tepper, O.: 'Current Trends in 3D Printing, Bioprosthetics, and Tissue Engineering in Plastic and Reconstructive Surgery', Current Surgery Reports, 2016, 4, (3), pp. 1-14; Sun, J., Zhou, W., Huang, D., Fuh, J. Y., and Hong, G. S.: 'An overview of 3D printing technologies for food fabrication', Food and Bioprocess Technology, 2015, 8, (8), pp. 1605-1615; and Stanton, M., Trichet-Paredes, C., and Sánchez, S.: 'Applications of three-dimensional (3D) printing for microswimmers and bio-hybrid robotics', Lab on a Chip, 2015, 15, (7), pp. 1634-1637). A major application of 3D printing has been in rapid prototyping and in-house designs of mechanical 3D structures (Berman, B.: '3-D printing: The new industrial revolution', Business horizons, 2012, 55, (2), pp. 155-162 and Lipson, H., and Kurman, M.: 'Fabricated: The new world of 3D printing' (John Wiley & Sons, 2013)). While various material formulas have been developed to be compatible with the different printing processes, plastics and polymers are the most common materials used for 3D printing (Hofmann, M.: '3D printing gets a boost and opportunities with polymer materials', ACS Macro Letters, 2014, 3, (4), pp. 382-386 and Wang, X., Jiang, M., Zhou, Z., Gou, J., and Hui, D.: '3D printing of polymer matrix composites: A review and prospective', Composites Part B: Engineering, 2017, 110, pp. 442-458). 3D structures made of plastics are almost limited to non-electrical/electronic applications. This has made the 3D printing methods less attractive for electronic circuit prototyping. Among a few different options for printing both conductive and non-conductive materials, fused deposition modeling (FDM) is the most economical method for prototyping (Boparai, K. S., Singh, R., and Singh, H.: 'Development of rapid tooling using fused deposition modeling: a review', Rapid Prototyping Journal, 2016, 22, (2), pp. 281-299). FDM printers work by extruding a thermoplastic filament through a nozzle. However, the carbon or metal nano-particle rich plastic filaments, used for printing conductive traces, are too resistive for many electronic circuits (Leigh, S. J., Bradley, R. J., Purssell, C. P., Billson, D. R., and Hutchins, D. A.: 'A simple, low-cost conductive composite material for 3D printing of electronic sensors', Plos one, 2012, 7, (11), pp. e49365). More importantly, due to the limited temperature that a plastic substrate can tolerate, soldering electronic components is a major challenge in all 3D printed technologies (Espalin, D., Muse, D. W., MacDonald, E., and Wicker, R. B.: '3D Printing multifunctionality: structures with electronics', The International Journal of Advanced Manufacturing Technology, 2014, 72, (5-8), pp. 963-978).

The proposed HEA copper electroplating method may be employed in a multiple nozzle FDM printer for both fast printing copper tracks 82 and soldering electronic components 90 to the tracks 82 at low temperatures, as illustrated in FIG. 1. In this approach, a low-cost carbon rich filament 14 may be used to print the layout of the circuit. Then, the conductive tracks 14 may be metallized with copper using an electroplating nozzle 10 developed as described herein. The advantageous prospect of this approach is that the HEA deposition method may also be used for growing copper across non-conductive gaps between circuit tracks 14 and SMD component terminals 90A to, for example, make a solid electric contact (soldering at low temperatures). This approach may enable the formation of 3D printed conductive structures 18 with integrated standard electronic components 90. Since this method does not require high temperatures for the contact formation, a solid electric contact may be deposited without damaging plastic support structures. This combined approach of copper deposition and rapid contact formation across gaps is a transformative aspect of the embodiments described herein. Accordingly, embodiments described herein enable the manufacturing of 3D hybrid structures composed of insulating 3D support structures, integrated standard electronic components, as well as conductive tracks connecting them.

The hypothesis is that the HEA electroplating process may be adapted for laterally localized growth of copper on 3D printed structures for the formation of electronic circuits that are directly integrated with 3D printed insulating support structures. The proof-of-concept demonstration of the HEA method is described in the preliminary results section described below. One of the advantages of the HEA method is that the HEA method may be integrated with any 3D FDM printer system due to simple implementation of the HEA method. This has the potential to enable low-cost electronic product rapid prototyping platforms.

Motivation. The conventional method of printed circuit board (PCB) fabrication is based on photolithographic etching of copper clad boards (subtractive approach), which includes several steps of darkroom lithography and chemical etching. Often PCBs have more than two layers of copper. In that case, the process needs to be repeated for each layer followed by stacking and lamination of the layers. The whole process needs special facilities and generates large amounts of chemical waste. After fabrication of the PCB, advanced machinery is needed for placing and soldering SMD components. Hence, the current approach of prototyping electronic circuits is a relatively expensive, time-consuming process, and largely limited to professional services. The current approach is also limited to two-dimensional (2D) structures where all components are soldered on top of the PCBs.

The unique benefits of additional manufacturing processes include flexibility and versatility. The direct link between computer generated models and 3D printed outputs enable fast product development with almost no chemical waste. Due to these unique features, different methods of printing conductive materials have been developed to promote the technology for electronic circuit prototyping (Leigh, S. J., Bradley, R. J., Purssell, C. P., Billson, D. R., and Hutchins, D. A.: 'A simple, low-cost conductive composite material for 3D printing of electronic sensors', Plos one, 2012, 7, (11), pp. e49365; Espalin, D., Muse, D. W., MacDonald, E., and Wicker, R. B.: '3D Printing multifunctionality: structures with electronics', The International Journal of Advanced Manufacturing Technology, 2014, 72, (5-8), pp. 963-978; and Cummins, G., and Desmulliez, M. P.: 'Inkjet printing of conductive materials: a review', Circuit World, 2012, 38, (4), pp. 193-213). However, the existing approaches for printing conductive materials are either not suitable for PCB fabrication or they are too expensive (both materials and printers) for prototyping. Additionally, none of the approaches tackle the issue of integrating standard electronic components.

Figure 2A:
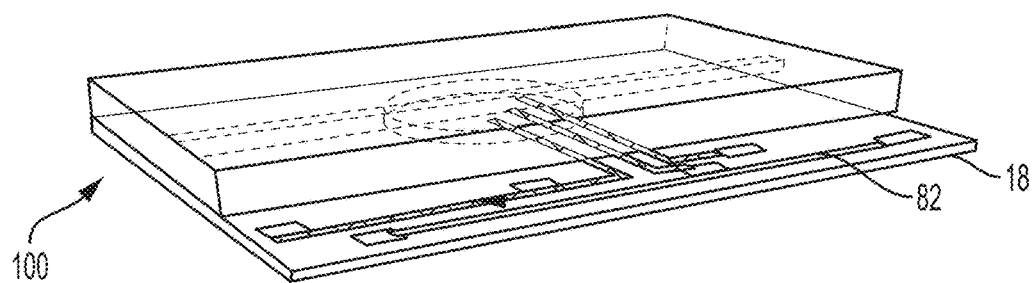
FIG. 2A schematically illustrates a lab-on-chip as an example for a 3D structure with integrated electronic circuits.
Figure 2B:
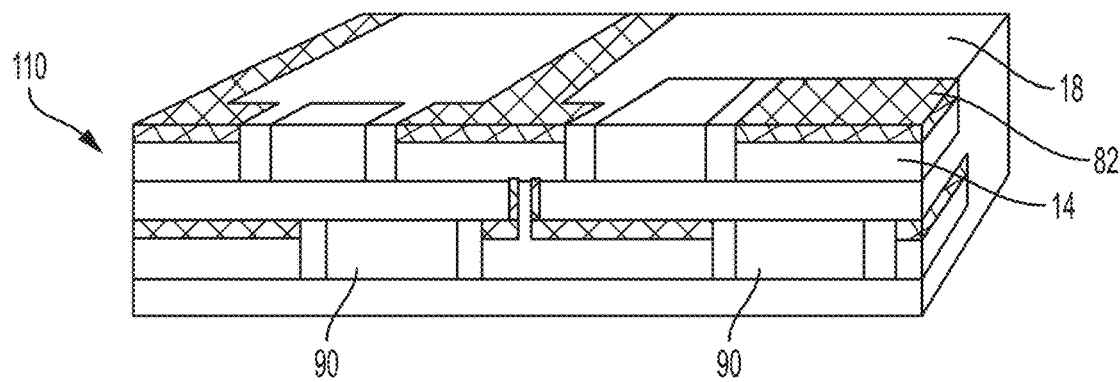
FIG. 2B schematically illustrates a true 3D electronic circuit as an example for a 3D structure with integrated electronic circuits FIG. 3 schematically illustrates a simple electrochemical cell for copper (Cu) electroplating (in a galvanostatic mode).

In contrast, the proposed approach described herein results in a simple low-cost method that is also compatible with existing standard 3D printing technologies for manufacturing of hybrid devices combining electronic and mechanical aspects in one package. Examples include small robots and drones. Additionally, the approach described herein enables fabrication of printable microfluidic lab-on-chip devices 100 for medical and environmental applications (Ho, C. M. B., Ng, S. H., Li, K. H. H., and Yoon, Y.-J.: '3D printed microfluidics for biological applications', Lab on a Chip, 2015, 15, (18), pp. 3627-3637), and true 3D electronic circuits 110 with multilayers of components for more compact designs, as illustrated in FIGS. 2A-2B. In particular, FIG. 2A schematically illustrates a lab-on-chip 100 and FIG. 2B illustrates a true 3D electronic circuit 110 as examples for 3D structures with integrated electronic circuits.

Further development of embodiments of the invention involves optimizing an electroplating nozzle system that may be integrated into existing FDM printer platforms. This adds the ability of laterally resolved rapid copper electroplating and low temperature soldering of electronic components to a standard FDM printer. To do this, theoretical and experimental study is undertaken of the HEA copper electrochemical reaction, which occurs at the overpotential conditions in a confined electrolyte-electrode interface. Various studies include:

Study the HEA electroplating method for rapid copper printing on 3D printed carbon based structures. This leverages the recently demonstrated HEA method. Transitioning this approach into a manufacturing and prototyping requires an investigation of the underlying physicochemical phenomena. One goal is to find optimized electrochemical conditions and appropriate 3D printed structures for electroplating copper layers with a low sheet resistance ($>0.5$ $\Omega$/square) and a sufficient adhesion strength ($>1$ MPa) while enabling a sufficient printing speed ($>0.5$ mm/s). The structure of deposited copper under systematically varied electrochemical conditions and their interface to the printed carbon support structures is also studied. Furthermore, the conductivity and adhesion of the copper layers may be correlated with the deposition conditions to find the best overall deposition coordinates. Advanced methods, such as scanning electron microscopy (SEM), may be employed to study the surface of the electroplated layers and their interfaces with the printed structure.

Study low-temperature electrochemical soldering. A transformative feature of the HEA process is that the HEA process may bridge gaps between electrodes due to rapid lateral dendrite growth under certain conditions. Hence, one goal is to optimize and harness the HEA process as a reliable "soldering" method for connecting SMD components to the metallized tracks generated by HEA. For practical applications, a soldering time of less than 20 seconds, a contact resistance lower than $1\Omega$, and a reliable mechanical strength are needed. This requires the study of the effect of the applied voltage and the electric field strength near the growth spot. These experiments also include a study of the resulting joint stability under vibrational conditions.

Study to design the electroplating nozzle system. The target is to bring the spatial electroplating resolution to below 0.8 mm to be compatible with the standard size of terminals on a SMD chip. The initial approach may be a coaxial tube design with negative pressure near the nozzle to prevent spreading of the electrolyte, as illustrated in FIG. 1. The research process may focus on experiments with different tube exit shapes to control surface tension and bead formation. For an efficient design, before fabricating the nozzle, the fluid behavior with finite element methods may be simulated. Additionally, a voltage controller module ay be designed before testing the nozzle on a FDM platform. The quality of the electroplated copper structures may be studied using SEM and electrical measurements.

Study to model and simulate the HEA electroplating process in confined spaces. HEA electroplating is a complicated electrochemical process. Employing the method for localized electroplating has some additional limitations. Using the method for the proposed research benefits from a detailed electrochemical analysis, studying ion diffusion/convection/migration and the simultaneous reduction of copper and hydrogen. Multi-physics software (in example, COMSOL) may be used to simulate the process. The results may enhance understanding of the HEA process, which may be helpful in finding optimized electroplating conditions and designing a practical nozzle structure.

The results of these studies may include: (1) a low-cost method for fast localized copper printing; (2) an approach for low-temperature soldering; (3) a FDM printer equipped with the electroplating nozzle; and (4) a theoretical analysis of the localized HEA electroplating process.

Intellectual Merit and Technological Impact

An intellectual merit of the embodiments described herein is an expansion of multi-material additive manufacturing techniques. Specifically, a main intellectual merit of the proposed research is the further development, optimization, and investigation of the HEA electroplating method described herein, such as an investigation of the HEA electroplating process in spatially confined electrolyte-electrode arrangements suitable for laterally resolved copper printing. The HEA electroplating method described herein has the potential to revolutionize the 3D printing of hybrid structure composed of electronic and isolating structures as well as mechanical features by, for example, giving it a method for the fabrication of hybrid structures with integrated electronics. Beyond 3D printing, the HEA electroplating method described herein also has potential applications in other technologies (for example, manufacturing technologies where laterally resolved metal deposition is a key component) where electronics need to be integrated with non-planar support structures, such as wearable and flexible/stretchable electronics or miniature autonomous robots. The proposed research is a cross-disciplinary effort, which leverages recent advancements within the field of 3D printing and electrochemistry to expand the knowledge base in several areas, including nano-structures and localized electrochemistry. Specifically: (1) this effort advances multi-material 3D printing technology for the fabrication of hybrid structures with integrated electronics, such as lab-on-chips or smart mechanics like robots and drones; (2) the developed novel metallization and low-temperature soldering technique promotes the application of electronics in soft materials for wearable, flexible, and stretchable electronics; and (3) the theoretical study of electrochemical processes in confined systems helps other efforts such as the development of small integrated bio-sensors for medical and environmental applications.

Challenges with Existing Approaches

Currently, there is no adequate 3D printing method for fast and inexpensive prototyping of electronic circuits and integrated electro-mechanical structures. The following summarizes currently available printing methods that are capable of printing both conductive and insulating materials structures and their limitations for prototyping hybrid structures containing electronic circuits.

FDM printers are the most affordable and common type of 3D printers currently used for prototyping (Boparai, K. S., Singh, R., and Singh, H.: 'Development of rapid tooling using fused deposition modeling: a review', Rapid Prototyping Journal, 2016, 22, (2), pp. 281-299). The operational mechanism is based on extruding a thermoplastic filament from the tip of a nozzle (also called an extruder) whose position on a XYZ-stage is controlled by the printer software (Wang, X., Jiang, M., Zhou, Z., Gou, J., and Hui, D.: '3D printing of polymer matrix composites: A review and prospective', Composites Part B: Engineering, 2017, 110, pp. 442-458). A 3D structure is constructed by printing different layers on top of each other. The two common filament materials are acrylonitrile butadiene styrene (ABS) and polylactic acid (PLA), which are both insulating materials with melting temperatures of 200° C. and 155° C., respectively (Olabisi, O., and Adewale, K.: 'Handbook of thermoplastics' (CRC press, 2016. 2016)).

High-conductance interconnects made of solid metals (for example, copper or solder mixtures) are used in electronic circuits for reliable operation and low power loss. ABS or PLA composite filaments containing graphite/carbon powder fillers are often used as low-cost conductive materials (Leigh, S. J., Bradley, R. J., Purssell, C. P., Billson, D. R., and Hutchins, D. A.: 'A simple, low-cost conductive composite material for 3D printing of electronic sensors', Plos one, 2012, 7, (11), pp. e49365 and Rymansaib, Z., Iravani, P., Emslie, E., Medvidović-Kosanović, M., Sak-Bosnar, M., Verdejo, R., and Marken, F.: 'All-Polystyrene 3D-Printed Electrochemical Device with Embedded Carbon Nanofiber-Graphite-Polystyrene Composite Conductor', Electroanalysis, 2016, 28, pp. 1517-1523). A typical conductive filament may have conductivity of 4.4 mS/cm, which is nine orders of magnitude less conductive than copper (Jo, A., Chae, H., Kim, Y., Kim, H., Paek, S., Soum, V., Jang, W., Ryu, S. R., Kwon, O.-S., and Shin, K.: 'Formulation of Conductive Filament Composited of Thermoplastic with Carbon Black for a Simple 3D Printing Electrical Device', Journal of Nanoscience and Nanotechnology, 2016, 16, (8), pp. 8415-8418).

To improve the conductivity, different forms of conductive fillers including graphene and carbon nanotubes (CNTs) have been studied (Rymansaib, Z., Iravani, P., Emslie, E., Medvidović-Kosanović, M., Sak-Bosnar, M., Verdejo, R., and Marken, F.: 'All-Polystyrene 3D-Printed Electrochemical Device with Embedded Carbon Nanofiber-Graphite-Polystyrene Composite Conductor', Electroanalysis, 2016, 28, pp. 1517-1523 and Wei, X., Li, D., Jiang, W., Gu, Z., Wang, X., Zhang, Z., and Sun, Z.: '3D printable graphene composite', Scientific reports, 2015, 5, pp. 11181). Although some composites have conductivities as high as ~5 S/cm, the composites are still far less conductive than copper (Zhang, D., Chi, B., Li, B., Gao, Z., Du, Y., Guo, J., and Wei, J.: 'Fabrication of highly conductive graphene flexible circuits by 3D printing', Synthetic Metals, 2016, 217, pp. 79-86 and Kalsoom, U., Nesterenko, P. N., and Paull, B.: 'Recent developments in 3D printable composite materials', RSC Advances, 2016, 6, (65), pp. 60355-60371). Due to their high intrinsic resistivity, the carbon based filaments have been used only for fabricating simple electronic circuits (Leigh, S. J., Bradley, R. J., Purssell, C. P., Billson, D. R., and Hutchins, D. A.: 'A simple, low-cost conductive composite material for 3D printing of electronic sensors', Plos one, 2012, 7, (11), pp. e49365). It should be noted that despite the high conductivity of metals, filaments containing copper or silver particle fillers are not electrically conductive because the particle concentration is lower than the required percolation threshold (Clay, C.: 'Electrically conductive thermoplastic elastomers in application to additive manufacturing', Doctoral Dissertation Southern Methodist University, 2014). Using high concentration of the metal particles changes the filament properties significantly, making them incompatible for FDM printing (Leigh, S. J., Bradley, R. J., Purssell, C. P., Billson, D. R., and Hutchins, D. A.: 'A simple, low-cost conductive composite material for 3D printing of electronic sensors', Plos one, 2012, 7, (11), pp. e49365). In other words, this issue cannot be solved by simply increasing the density of the metal particles because this changes the filament properties beyond compatibility for FDM printing.

Another 3D printing method is called direct energy deposition. In this method, the printer nozzle drops powders of a plastic or a metal while the powder is melted at the tip of the nozzle with a laser beam, an electron beam, or plasma arc (Zhai, Y., Lados, D. A., and LaGoy, J. L.: 'Additive manufacturing: making imagination the major limitation', JOM, 2014, 66, (5), pp. 808-816). This is a rapid printing method with the capability of co-printing metals and insulators. However, only metal alloys with low melting temperature may be used in this approach to prevent damage to the plastic support structure (Espalin, D., Muse, D. W., MacDonald, E., and Wicker, R. B.: '3D Printing multifunctionality: structures with electronics', The International Journal of Advanced Manufacturing Technology, 2014, 72, (5-8), pp. 963-978 and Mireles, J., Kim, H.-C., Lee, I. H., Espalin, D., Medina, F., MacDonald, E., and Wicker, R.: 'Development of a fused deposition modeling system for low melting temperature metal alloys', Journal of Electronic Packaging, 2013, 135, (1), pp. 011008). Nevertheless, due to the advanced melting process, printers using this approach are expensive and not suitable for low-cost prototyping.

Another previously explored approach for printing conductive materials is the inkjet method. There are already various forms of conductive inks made of metal (for example, silver, copper, and nickel) nanoparticles in a solvent developed for 2D and 3D printing of conductive patterns/structures (Park, B. K., Kim, D., Jeong, S., Moon, J., and Kim, J. S.: 'Direct writing of copper conductive patterns by ink-jet printing', Thin Solid Films, 2007, 515, (19), pp. 7706-7711; Perelaer, J., de Gans, B. J., and Schubert, U. S.: 'Ink-jet printing and microwave sintering of conductive silver tracks', Advanced materials, 2006, 18, (16), pp. 2101-2104; Li, D., Sutton, D., Burgess, A., Graham, D., and Calvert, P. D.: 'Conductive copper and nickel lines via reactive inkjet printing', Journal of Materials Chemistry, 2009, 19, (22), pp. 3719-3724; and Wang, X., Jiang, M., Zhou, Z., Gou, J., and Hui, D.: '3D printing of polymer matrix composites: A review and prospective', Composites Part B: Engineering, 2017, 110, pp. 442-458).

However, the concentration of nanoparticles again has to be above a certain percolation threshold to achieve conductive printed patterns/structures (Park, J. S.: 'Design of 3D-Printable Conductive Composites for 3D-Printed Battery', Doctoral Dissertation, Applied Sciences: School of Mechatronic Systems Engineering, Samon Fraiser University, 2016). The required high concentrations of particles affect the viscosity of the ink (Jo, Y. H., Jung, I., Choi, C. S., Kim, I., and Lee, H. M.: 'Synthesis and characterization of low temperature Sn nanoparticles for the fabrication of highly conductive ink', Nanotechnology, 2011, 22, (22), pp. 225701). Clogging of nozzles is a common problem in inkjet printing of conductive inks (Ahmadloo, M., and Mousavi, P.: 'A novel integrated dielectric-and-conductive ink 3D printing technique for fabrication of microwave devices', in Editor (Ed.)^(Eds.): 'Book A novel integrated dielectric-and-conductive ink 3D printing technique for fabrication of microwave devices' (IEEE, 2013, edn.), pp. 1-3). Due to the cost of the ink and nozzles, this type of printing is still not competitive to the traditional PCB prototyping and is less popular than the other mentioned 3D printing methods (Wang, X., Jiang, M., Zhou, Z., Gou, J., and Hui, D.: '3D printing of polymer matrix composites: A review and prospective', Composites Part B: Engineering, 2017, 110, pp. 442-458). Although there are other methods of 3D printing, such as selective laser sintering (SLS) and photopolymerization, most of these methods are not able to print metals on insulating structures (Wang, X., Jiang, M., Zhou, Z., Gou, J., and Hui, D.: '3D printing of polymer matrix composites: A review and prospective', Composites Part B: Engineering, 2017, 110, pp. 442-458).

Soldering problem: The insulator material in a 3D printed structure is a plastic with a typical melting point below 200° C. (Olabisi, O., and Adewale, K.: 'Handbook of thermoplastics' (CRC press, 2016)). Conventional soldering materials, containing lead, need at least 340° C. to melt (Manko, H. H.: 'Solders and soldering' (McGraw-Hill Professional Publishing, 1979)). The melting temperature for lead-free soldering materials is above 380° C. (Ganesan, S., and Pecht, M. G.: 'Lead-free electronics' (John Wiley & Sons, 2006)). Modern soldering methods for SMD components use soldering pastes with curing temperatures in the range of 250° C. (Manko, H. H.: 'Soldering handbook for printed circuits and surface mounting' (Springer Science & Business Media, 1995)). The required application of heat to melt and/or cure the soldering paste melts or deforms 3D printed plastic structures. A safe solution that may be applied for fabricating simple electronic circuits is to use silver paste instead of soldering materials and dry it at a low temperature. However, electric contacts made with silver paste are not mechanically robust and are vulnerable to vibration. Hence, this process is not reliable enough for manufacturing processes. The proposed development of a simple and inexpensive method for copper printing and low-temperature soldering promotes the application of 3D printers in more complex systems with advanced integrated electronics.

Accordingly, the soldering process provides a challenge. The low melting temperature of the thermoplastics used for 3D printing is not compatible with the conventional soldering approach using heat for soldering. The same problem exists for wearable, flexible, and stretchable electronics using temperature sensitive materials as the substrate. The embodiments described herein are capable of not only metalizing high resistive interconnects on a temperature sensitive substrate, but also making solid electric contacts between the terminals of electronic components and conductive traces (a replacement for soldering) at room temperature. The method described herein is based on localized electroplating at elevated voltages.

An existing approach for localized electroplating: A common approach for "localized electroplating" is brush plating (Raja, S.: 'The systematic development of Direct Write (DW) technology for the fabrication of printed antennas for the aerospace and defence industry', Doctoral Dissertation, Mechanical, Electrical and Manufacturing Engineering, Loughborough University, 2014; Wang, W., Liu, X., and Shi, Z.: 'Mechanisms and influences of electro-brush plating micro-force on coatings performances', Journal of Materials Research, 2016, 31, (15), pp. 2337-2346; and Hu, K., Xu, Q. X., and Yang, X. L.: 'Fabrication of superhydrophobic surfaces on copper substrates via brush plating technique', Advanced Materials Research, 2014, 834, pp. 662-669), in which a compressed and porous fabric, such as felt, may be used at the tip of a marker-like nozzle. The fabric is kept wet through a wick connection to the electrolyte reservoir with the anode contact. Placing the tip on a track, the electrochemical interface is limited to the contact point. Despite the simplicity, brush plating requires constant maintaining services due to the short lifetime of the tip. Because of the friction between the marker tip and the surface when the nozzle is moved over the surface, the tip is abraded quickly (Guojun, W., and Qunjia, C. Y. P.: 'Study on Friction and Wear Properties of Carbon Fiber Felt Copper Composites', Acta Materiae Compositae Sinica, 1997, 2, pp. 1-7). A more serious problem, occurring shortly after starting the copper deposition, is the growth of copper on the marker tip, which requires frequent change of the tip to preserve the quality of the deposition. The embodiments described herein address all the above issues and offer a practical approach.

Figure 3:
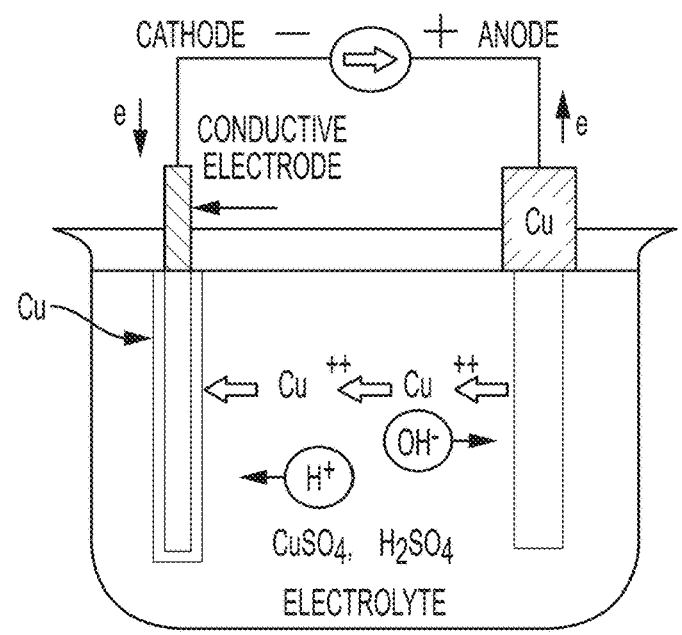

The copper electroplating process is simple and inexpensive. In the usual approach, the conductive object to be coated with copper is used as the cathode in an electrochemical cell containing a liquid electrolyte and a copper piece as the anode, as illustrated in FIG. 3. FIG. 3 schematically illustrates a simple electrochemical cell for copper (Cu) electroplating (the galvanostatic mode). A common electrolyte is a solution of $CuSO_4$ and $H_2SO_4$ in water (Lou, H. H., and Huang, Y.: 'Electroplating', Encyclopedia of Chemical Processing, 2006, 1, pp. 839-848). Running a DC current through the cell deposits copper on the cathode. The mechanism of coating is based on two electrochemical reactions taking place at the anode and cathode. At the anode, copper metal is oxidized to copper ions ($Cu \rightarrow Cu^{2+} + 2e$). At the cathode, the copper ions are reduced to solid metal ($Cu^{2+} + 2e \rightarrow Cu$). Since for every generated copper ion at the anode, one copper atom is deposited on the cathode, the concentration of $Cu^{2+}$ in the electrolyte does not change during electroplating. Hence, the process may be continued until the anode copper is fully consumed. Considering the nature of the electrochemical interface, the method may only deposit copper on a part of the cathode that is conductive and is in contact with the electrolyte. Due to the potential difference on the surface of a large cathode electrode made of high resistive materials (for example, carbon based printed tracks), copper grows with different rates at different spots of the electrode. For that reason, it is important to use a localized electroplating method for metalizing carbon printed tracks. The thickness of the coated layer, $d$, may be easily controlled through the deposition time, $t$, when a constant current, $I$, is applied to the cell (in example, galvanostatic deposition mode). Also, the growth rate is proportional to $I$, as expressed by the Faraday equation (Bard, A. J., and Faulkner, L. R.: 'Electrochemical Methods Fundamentals and Applications', John Wiley, New York, 2001):

$$d = \frac{IM_w}{nAF\rho}t \qquad \text{Equation (1)}$$

where $M_w$ is the atomic weight of copper (63.5 g/mol), F is the Faraday constant (~96485 C/mol), n is the change in the oxidation state (n=2 for $Cu^{2+}$ to Cu), and $\rho$ is the copper density (8.63 g/cm$^3$) and A is the active area of the electrode. A typical current density (I/A) of 20 mA/cm$^2$ implies ~7.6 nm/s rate (Kumar, T. N., Kulkarni, M., Ravuri, M., Elangovan, K., and Kannan, S.: 'Effects of Electroplating on the Mechanical Properties of FDM-PLA Parts', i-Manager's Journal on Future Engineering and Technology, 2015, 10, (3), pp. 29). With such a rate, growing a 35 µm thick layer of copper (copper thickness in FR-4 PCBs) would take ~80 minutes.

A reversible reaction, such as $Cu^{2+}+2e\leftrightarrow Cu$, has an electrochemical potential, $E_0$, which is usually expressed versus a reference (Bard, A. J., and Faulkner, L. R.: 'Electrochemical Methods Fundamentals and Applications', John Wiley, New York, 2001). At this potential the rate of the forward and backward reactions is the same and the net charge/mass transfer is zero (Bard, A. J., and Faulkner, L. R.: 'Electrochemical Methods Fundamentals and Applications', John Wiley, New York, 2001). Applying a voltage slightly larger than $E_0$ (called overpotential, $\eta$) results in more oxidation of copper than reduction and dominates $Cu\rightarrow Cu^{2+}+2e$. Likewise a small negative overpotential is in favor of $Cu^{2+}+2e\rightarrow Cu$. Hence, the potential difference across a galvanostatic cell is $2\eta$ (+$\eta$ at the anode, −$\eta$ at the cathode), which is typically lower than 0.5 V (Bard, A. J., and Faulkner, L. R.: 'Electrochemical Methods Fundamentals and Applications', John Wiley, New York, 2001).

Electroplating may also be done at constant voltages (potentiostat mode) by using a voltage source instead of a current source. In the case of small voltages, the process is no different than the galvanostatic mode. To increase the growth rate, larger voltages may be applied. Although at low voltages anodic and cathodic currents change exponentially with the overpotential (Bard, A. J., and Faulkner, L. R.: 'Electrochemical Methods Fundamentals and Applications', John Wiley, New York, 2001), at higher voltages the current is limited by the cell resistance (typically large for localized electroplating) when trying to increase the growth rate (Bard, A. J., and Faulkner, L. R.: 'Electrochemical Methods Fundamentals and Applications', John Wiley, New York, 2001). Hence, for cell voltages between ~0.5 V and ~1.2 V the current increases almost linearly but fairly flatly with increasing voltage, resulting in an only limited increase of the growth rate. However, the mechanism limiting the growth rate changes once the cell voltage is near 1.2 V at which water electrolysis starts.

During electrolysis, hydrogen evolves at the cathode. The rapid diffusion of hydrogen ions toward the cathode assists the convection of $Cu^{2+}$ ions, as well, resulting in a substantial reduction of the electrolyte resistance and an increase of the electric current. Although the DC current is only partially consumed for the copper electroplating and the rest is used for water splitting, the copper growth rate increases considerably due to the formation of copper nanostructures with a lower density than a compact copper layer (Equation 1) (Nikolić, N., Branković, G., Pavlović, M., and Popov, K.: 'The effect of hydrogen co-deposition on the morphology of copper electrodeposits. II. Correlation between the properties of electrolytic solutions and the quantity of evolved hydrogen', Journal of Electroanalytical Chemistry, 2008, 621, (1), pp. 13-21; Nikolić, N., Pavlović, L. J., Pavlović, M., and Popov, K.: 'Formation of dish-like holes and a channel structure in electrodeposition of copper under hydrogen co-deposition', Electrochimica Acta, 2007, 52, (28), pp. 8096-8104; and Nikolić, N., Popov, K., Pavlović, L. J., and Pavlović, M.: 'The effect of hydrogen codeposition on the morphology of copper electrodeposits. I. The concept of effective overpotential', Journal of Electroanalytical Chemistry, 2006, 588, (1), pp. 88-98). The hydrogen gas bubbles cause the structure of the electroplated layer to be more porous, but with a similar conductivity as solid copper and a remarkable mechanical strength suitable for use as interconnects on PCBs. Hence, the combination of the ion convection effect with the development of a porous structure in the HEA method results in a much higher growth rate than that in a non-HEA approach. Furthermore, employing an electric field near the surface of the cathode, the growth rate parallel to the electric field may be much higher than in other directions due to the ions' migration (Yoo, W. C., and Lee, J. K.: 'Field-Dependent Growth Patterns of Metals Electroplated in Nanoporous Alumina Membranes', Advanced materials, 2004, 16, (13), pp. 1097-1101; Madden, J. D., Lafontaine, S., and Hunter, I.: 'Fabrication by electrodeposition: building 3D structures and polymer actuators', in Editor (Ed.)^(Eds.): 'Book Fabrication by electrodeposition: building 3D structures and polymer actuators' (IEEE, 1995, edn.), pp. 77-81; and Madden, J. D., and Hunter, I. W.: 'Three-dimensional microfabrication by localized electrochemical deposition', Journal of microelectromechanical systems, 1996, 5, (1), pp. 24-32).

Although the effect of hydrogen evolution on the structure of deposited copper has been studied by many research groups (Nikolić, N., Branković, G., Pavlović, M., and Popov, K.: 'The effect of hydrogen co-deposition on the morphology of copper electrodeposits. II. Correlation between the properties of electrolytic solutions and the quantity of evolved hydrogen', Journal of Electroanalytical Chemistry, 2008, 621, (1), pp. 13-21; Nikolić, N., Pavlović, L. J., Pavlović, M., and Popov, K.: 'Formation of dish-like holes and a channel structure in electrodeposition of copper under hydrogen co-deposition', Electrochimica Acta, 2007, 52, (28), pp. 8096-8104; Nikolić, N., Popov, K., Pavlović, L. J., and Pavlović, M.: 'The effect of hydrogen codeposition on the morphology of copper electrodeposits. I. The concept of effective overpotential', Journal of Electroanalytical Chemistry, 2006, 588, (1), pp. 88-98; Chen, K., Wang, Y., Chang, L., Li, F., and Chang, S.: 'Investigation of overpotential and seed thickness on damascene copper electroplating', Surface and Coatings Technology, 2006, 200, (10), pp. 3112-3116; Gallaway, J. W., Willey, M. J., and West, A. C.: 'Acceleration kinetics of PEG, PPG, and a triblock copolymer by SPS during copper electroplating', Journal of The Electrochemical Society, 2009, 156, (4), pp. D146-D154; and Morales-Guio, C. G., Tilley, S. D., Vrubel, H., Grätzel, M., and Hu, X.: 'Hydrogen evolution from a copper (I) oxide photocathode coated with an amorphous molybdenum sulphide catalyst', Nature communications, 2014, 5, pp. 1-7), the "localized" HEA electroplating process has never been employed for electroplating 3D printed structures or other substrates, such as fabrics, plastics, and rubbers. Lateral growth rates of ~110 μm/s with the HEA electroplating method described herein have already been demonstrated.

New Approach

The copper growth rate in conventional galvanostatic electroplating without HEA is too slow. Embodiments described herein are based on employing the features in HEA electroplating for fast printing metals on conductive patterns and growing metals in a gap between component terminals and interconnect lines at low temperatures. In particular, embodiments of the invention provide (1) a method of localized electroplating, (2) a method of low temperature soldering, and (3) a tool enabling the metallization and soldering process.

The proposed solution for upgrading a FDM printer for PCB fabrication and electronic circuit assembly involves adding a HEA electroplating nozzle 10. The nozzle 10 allows the direct and integrated metallization of pre-deposited carbon based "template tracks" 14, while also enabling a low-temperature soldering process compatible with the underlying FDM plastic structure 18. A key part of this design challenge is to localize the electroplating process enabling a lateral deposition resolution suitable for pattern deposition. A sketch of such a nozzle 10 is shown in FIG. 1. The nozzle tip 22 may be made of a two coaxial tubes 26, 30. The inner tube 26 is connected to a reservoir 34 containing the electrolyte ($CuSO_4 + H_2SO_4$) and a copper anode 38. A small scroll pump 42 constantly extracts the electrolyte through the outer tube 30. This combination circulates the electrolyte at the nozzle tip 22, which helps to remove the emerging hydrogen bubbles (as shown, for example in FIG. 6) from the cathode 46, 50. Considering the targeted electroplating resolution of 0.8 mm, a mechanism for removing hydrogen bubbles may prevent partial passivation of the electrode surface, which may interfere with the deposition process. When the tip 22 is near the surface 54 of the workpiece 14, the electrolyte-substrate interface is limited to the diameter of the outer tube 30 and the surface tension of the solution, which controls the diameter of the forming meniscus 58. To balance forces, the pressure in the inner tube 26 may be controlled with another pump 62.

Figure 4A:
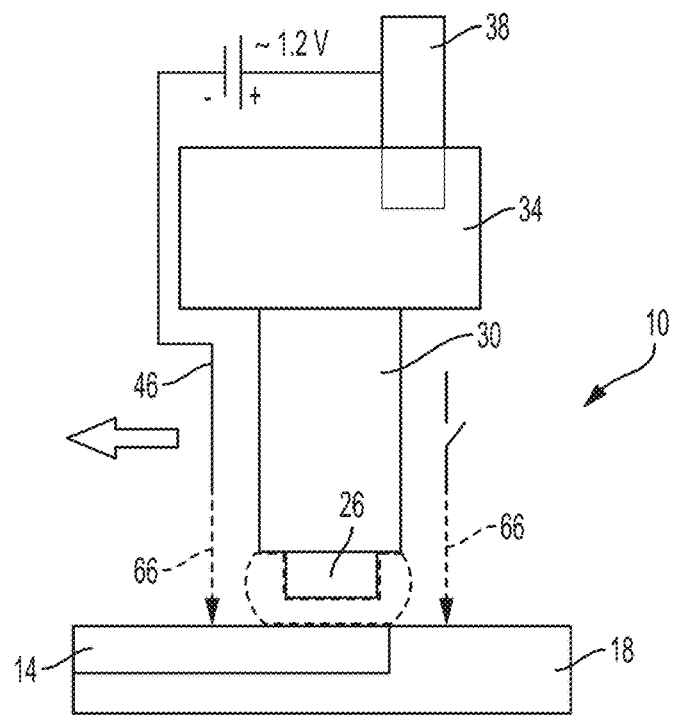
FIG. 4A schematically illustrates a nozzle position at the beginning of a carbon track.
Figure 4B:
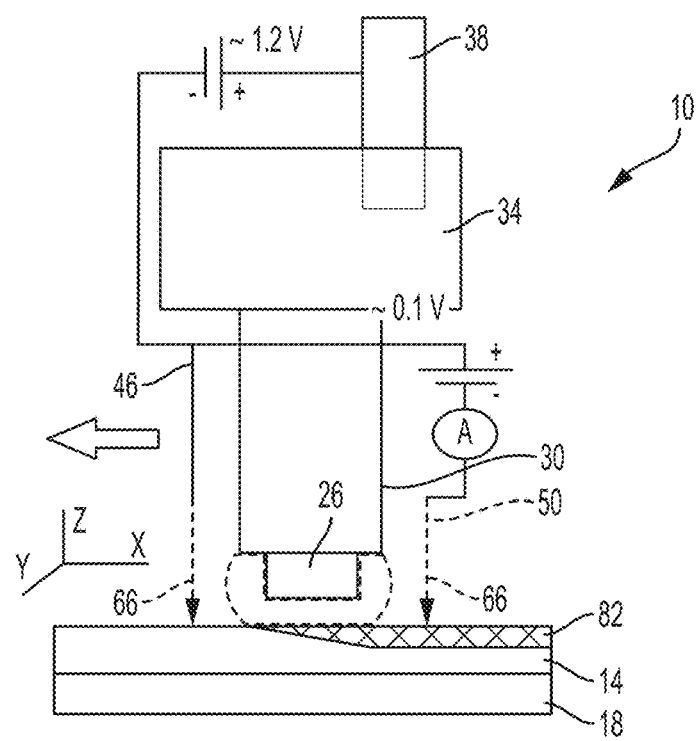
FIG. 4B schematically illustrates a nozzle position at the middle of a carbon track.

A mechanism similar to the one used in electric motors for making electric contacts to the copper plated areas on the motor shaft, called a commutator, may be employed for making contacts to the tracks 14, as illustrated in FIG. 1. In an electromotor, soft graphite electrodes (for example, brushes) supported by small springs are gently pressed upon the commutator when the rotor is rotating. To accommodate the contact pins 66 as close as possible to the nozzle head 22, graphite electrodes with a high aspect ratio (for example, a mechanical pencil lead) may be used as the pins 66. A spring 70 and a tube 74 guide may be used to mimic the durable brush-commutator combination. Four of the graphite pins may be placed around the nozzle 10. One pair of graphite pins 66 may be positioned across the nozzle 10 in an X-axis direction, as illustrated in FIGS. 4A and 4B. Another pair of graphite pins 66 may be positioned across the nozzle 10 in a y-axis direction, as illustrated in FIGS. 4A and 4B. A large standard anode 38 may be used for testing the nozzle design. A feeding mechanism for anode wire may be considered for later product prototype designs to enable continuous operation in manufacturing environments.

For PCB fabrication using the proposed technique, the circuit layout is printed first with a conductive carbon filament 14 on the desired plastic (ABS or PLA) substructure 18. Subsequently, the electroplating nozzle 10 is used for coating the conductive carbon tracks with a copper layer 82. For electroplating, the tip 22 is positioned at a certain distance above the printed layout 14 to ensure that the electrolyte is in contact with the carbon printed track 14. In this position, at least one pin 66 lands on the conductive carbon track 14 to make electrical contact. Application of a voltage of ~1.2 V between the anode 38 and cathode 46, 50 causes copper to grow on the carbon printed track 14. Moving the nozzle 10 along the track 14 under computer control metallizes the whole track 14, similar to the prior deposition of plastic layers 18. For coating a thick layer of copper 82, the nozzle 10 may go over the track 14 several times.

Although at the beginning of the electroplating process, only one pin 66 may be in contact with the track 14 (a single cathode configuration), shortly after starting the nozzle scan, the opposite pin 66 also makes contact with the track 14. For example, FIGS. 4A and 4B illustrate the position of the pins 66, the nozzle 10, and the track 14. FIG. 4A illustrates the nozzle position at the beginning of the carbon track 14 while FIG. 4B illustrates the nozzle position at the middle of the carbon track 14. A movement direction of the nozzle 10 is represented by the large arrows included in FIGS. 4A and 4B.

The dual cathode contact mode may be used for both assisting the electroplating process and in-situ sensing the quality of the electroplated area. During the electroplating, a small voltage between the two pins 66 generates a potential profile along the carbon printed track 14, which makes the lateral copper growth rate faster than the vertical growth rate (migration effect). This enhances the speed of "copper printing." Also, the amount of electric current passing between the two pins 66 may be an indication for the quality of the electroplated copper 82 under the tip 22. The resistance between the two pins 66 may be high (low current) when there is no layer of copper 82 or a thin layer of copper 82. The resistance drops (current increases) as a conductive enough layer is formed on top of the carbon tracks 14. A sensing mechanism 86 (for example, an ammeter that monitors the current along the track) may be employed in a control loop for adjusting the scan speed of the nozzle. It should be mentioned that each PCB 6 may be designed with tracks 14 only parallel to the X-Y axes conforming with the 4-pin electrode arrangement mentioned above.

Figure 5A:
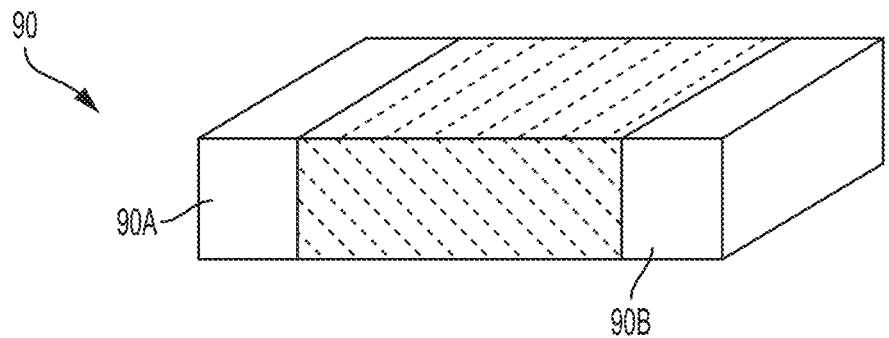
FIG. 5A schematically illustrates a typical SMD component
Figure 5B:
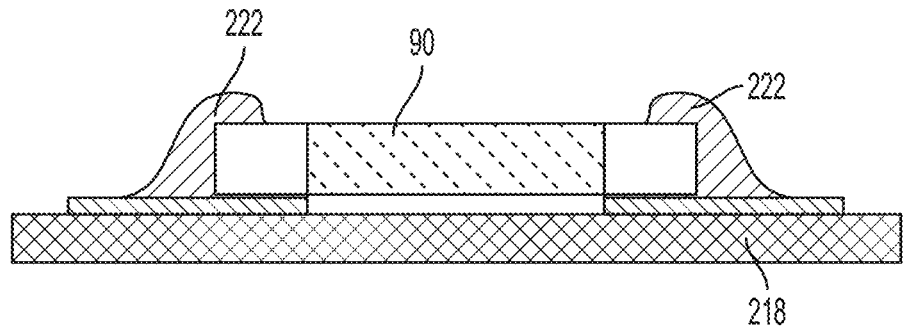
FIG. 5B schematically illustrates the SMD component of FIG. 5A soldered on a conventional PCB.
Figure 5C:
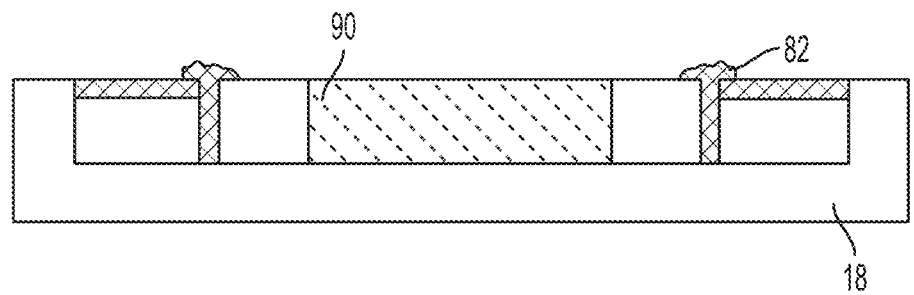
FIG. 5C schematically illustrates the SMD component of FIG. 5A soldered in a 3D printed substrate with electroplated solder.

Soldering: In conventional PCBs, all components sit on top of the PCB 6. Due to the versatility of 3D printed structures, a PCB 6 may be fabricated with cavities for accommodating the components, as illustrated in FIGS. 5A-5C. FIG. 5A illustrates a typical SMD component 90 (4532 footprint) having two terminals 90A, 90B. FIGS. 5B and 5C illustrate the typical SMD component 90 soldered on a conventional FR-4 PCB 218 with solder 222 (see FIG. 5B) and in a 3D printed substrate 18 with the electroplated solder 82 (see FIG. 5C). Fabrication of the PCB 6 with cavities for accommodating the components 90 is particularly helpful for SMD components 90 that must be held in position for soldering. Insertion of the components 90 into cavities also results in flat circuits, which may be useful for many applications where mechanical stability is a concern. The same proposed design for the electroplating nozzle 10 may be used for soldering. When a SMD terminal 90 is large enough to allow the dual cathode configuration for the soldering, copper 82 grows to make contact across the gap. Otherwise, the copper 82 grows from the pad/track to reach the component terminal. The preliminary experimental results confirm the feasibility of both approaches.

Proof of Concept—Prior Work and Preliminary Results

Figure 6:
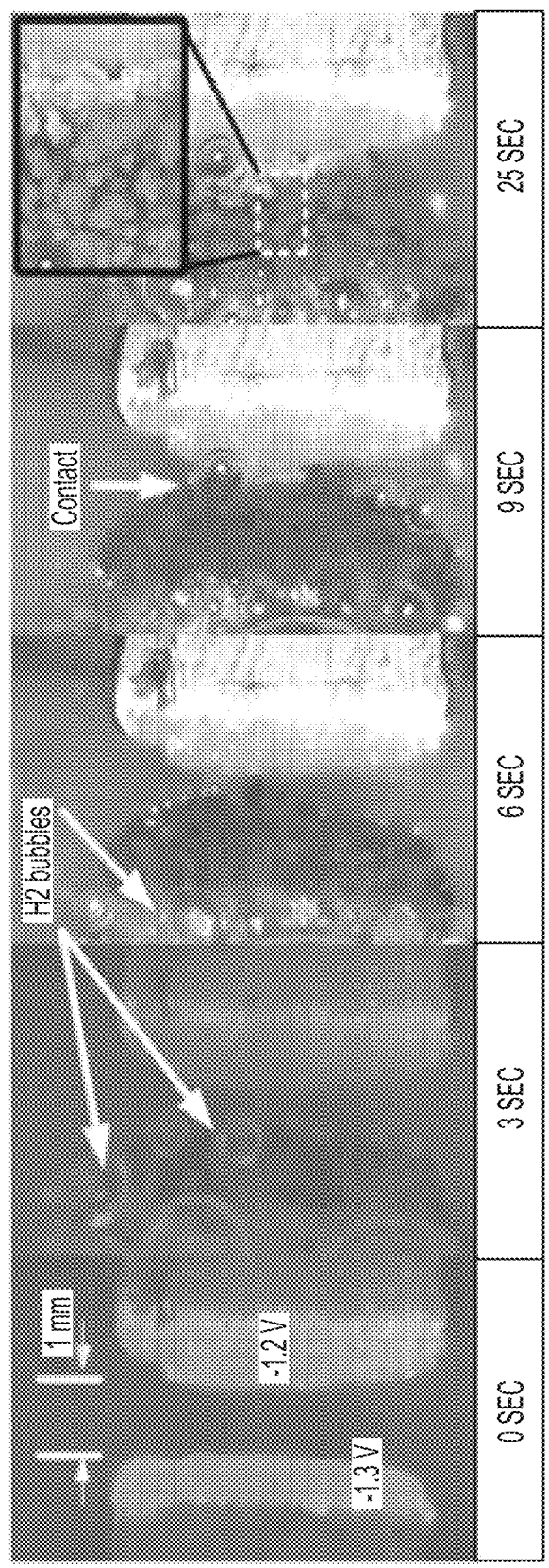
FIG. 6 illustrates the growth rate of a HEA electroplating process.

In preliminary HEA studies, two copper tracks (~4 mm wide) were patterned on a FR-4 PCB using the standard lithography and etching process with ferric chloride solution (using a permanent marker as the mask and ferric chloride solution for etching copper in the non-masked area). The two copper tracks were facing each other with a gap of 1 mm and both were used as cathodes. Using an O-ring, a small electrochemical bath was made around the cathodes (around the gap between the two cathodes). A large separated copper pad on the pattern was used as the anode. An aqueous based solution containing CuSO4 (1 M) and H2SO4 (1 M) and a piece of copper wire were used in the bath as the electrolyte and the anode, respectively. A microscope camera was set on top of the cell to record the process. First, the same potential was applied to both cathode electrodes, which were connected together, while the cell was tested in the galvanostatic mode with a current density of 20 mA/cm2 (Kumar, T. N., Kulkarni, M., Ravuri, M., Elangovan, K., and Kannan, S.: 'Effects of Electroplating on the Mechanical Properties of FDM-PLA Parts', i-Manager's Journal on Future Engineering and Technology, 2015, 10, (3), pp. 29). The growth rate on the cathodes was extremely slow and almost no change in the pattern was observed 10 minutes after the experiment had started. The cathode voltage with respect to the anode was −0.4 V. To enhance the lateral growth, two different voltages (−0.4 V and −0.3 V) were applied to each cathode. This resulted in a voltage difference of 0.1 V between the two cathodes, establishing an electric field across the gap. The results did not show any improvement in the copper growth, mainly due to the slow deposition rate. However, after applying −1.3 V and −1.2 V, hydrogen bubbles appeared near the cathodes, and the electroplating rate increased. The process was fast enough to bridge the gap between the two electrodes in only 9 seconds (growth rate of 110 μm/s), forming a narrow contact, as illustrated in FIG. 6. As soon as the contact was made, the voltage of both cathodes became the same (short circuit). The growth process with −1.2 V for the both cathodes was continued to make a stronger contact. As shown in FIG. 6, after 25 seconds, the contact area was almost as wide as the tracks (4 mm). The resistance between the two tracks was measured at the start of the bridge formation (9 seconds) and at the end of the process (25 seconds), which showed a resistance drop from 6Ω to 1.5Ω. The large difference in the texture of the grown copper and the copper on the electrodes suggests a non-compact and likely porous structure for the HEA electroplated copper. The observed low resistance of the electroplated copper is a promising sign that HEA electroplating may be used for rapid copper deposition.

Figure 7A:
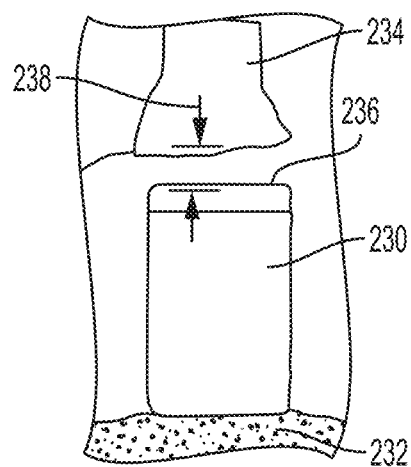
FIG. 7A illustrates a gap between a light emitting diode (LED) and a copper pad before low temperature HEA soldering of the LED.
Figure 7B:
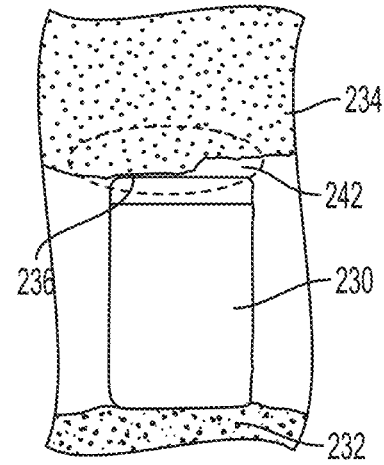
FIG. 7B illustrates a single-cathode soldering method of low temperature HEA soldering of an LED.
Figure 7C:
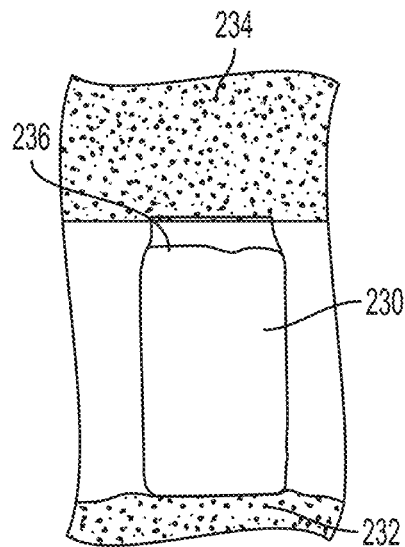
FIG. 7C illustrates confirmation of the functionality of the low temperature HEA soldering of the LED.
Figure 7D:
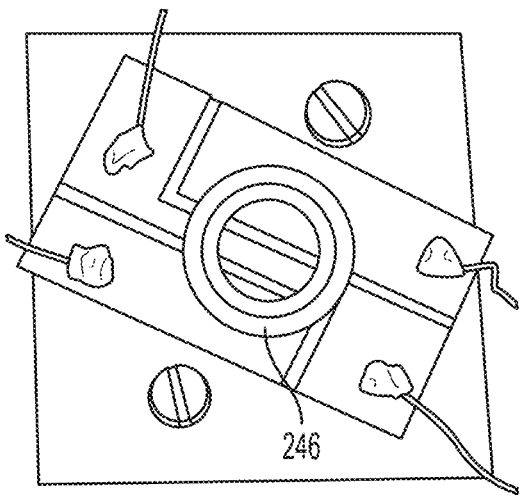
FIG. 7D illustrates an experiment setup with a patterned copper and the electrochemical bath with an O-ring.

To confirm the possibility of using the approach for low temperature soldering, a SMD light emitting diode (LED) 230 was placed across a larger gap between two patterned copper tracks 232, 234, as illustrated in FIGS. 7A-7D. Conventional soldering was used to solder one terminal of the device 230 to a copper track 232, leaving a gap 238 of ~1 mm between the opposite terminal 236 of the device and the second copper track 234, as illustrated in FIG. 7A. Then, the copper track 234 was connected to −1.2 V with respect to the anode copper wire in the electrolyte (single cathode configuration), as illustrated in FIG. 7B. The electrochemical soldering process took about 1 minute to successfully grow copper 242 from the track 234 to the LED terminal 236. As shown in FIGS. 7C and 7D, the LED 230 was functional when the tracks were connected to a power supply. FIG. 7D illustrates the experiment setup with the patterned copper and the electrochemical bath with the O-ring 246. This confirmed the feasibility of using the electroplating process for soldering and also demonstrated that exposing the electronic components to the electrolyte does not damage components. The resistance of the grown copper at the joint was measured with a multimeter to be 3.2Ω.

The feasibility of electroplating copper onto a 3D printed structure was also demonstrated by coating the surface of a PLA printed piece with a thin film of conductive carbon grease. HEA electroplating was then applied to grow copper over the sample. While the carbon grease track (1 cm long) had a resistance of ~3 kΩ before electroplating, the resistance dropped to 4.7Ω after the electroplating process.

The preliminary results show that the HEA approach has substantial merit. Further study and research is described below.

Study of HEA electroplating of 3D printed carbon tracks: The goal of Task 1 is to find optimized electrochemical parameters and suitable 3D printed carbon topologies for successful and reproducible Cu electroplating with a resistance of less than 0.5 Ω/square, an adhesion strength higher than 1 MPa, and a printing speed faster than 0.5 mm/s.

Electrical connections between components in a circuit have to be mechanically robust with low electrical resistance. Traditional PCB fabrication is a top-down (subtractive) process in which a copper foil laminated to a non-conductive substrate (in example, FR-4) is patterned via lithography and an etching process. Due to the low melting point of 3D printed plastics, copper lamination is not an option for 3D printed structures. In contrast, the proposed circuit prototyping method is a bottom-up approach (additive) in which the desired layout is printed directly to the substrate using a carbon-based plastic with subsequent HEA copper coating. The research under this task focuses on achieving an electroplating speed close to the 3D printing speed while maximizing adhesion between the copper and underlying carbon layers to reach a strength similar to that in a FR-4 PCB. Reducing/avoiding defects in the copper layer is a priority for achieving low enough resistances. This requires studying the effect of the composition of the carbon conductive filaments as well as the impact of the electroplating conditions on the electrical resistance, mechanical strength, and the growth speed of the copper layer.

Effect of the carbon based filament on the quality of the electroplated copper layer: Off-the-shelf conductive filaments are made of conductive particles (fillers) in an ABS or PLA matrix. A majority of commercial products use carbon black as a conductive ingredient. There have been several efforts to improve the conductivity through the use of multi-wall carbon nanotubes (MW CNT), graphite particles, and graphene as fillers (Leigh, S. J., Bradley, R. J., Purssell, C. P., Billson, D. R., and Hutchins, D. A.: 'A simple, low-cost conductive composite material for 3D printing of electronic sensors', Plos one, 2012, 7, (11), pp. e49365; Jo, A., Chae, H., Kim, Y., Kim, H., Paek, S., Soum, V., Jang, W., Ryu, S. R., Kwon, O.-S., and Shin, K.: 'Formulation of Conductive Filament Composited of Thermoplastic with Carbon Black for a Simple 3D Printing Electrical Device', Journal of Nanoscience and Nanotechnology, 2016, 16, (8), pp. 8415-8418; Wei, X., Li, D., Jiang, W., Gu, Z., Wang, X., Zhang, Z., and Sun, Z.: '3D printable graphene composite', Scientific reports, 2015, 5, pp. 11181; and Postiglione, G., Natale, G., Griffini, G., Levi, M., and Turri, S.: 'Conductive 3D microstructures by direct 3D printing of polymer/carbon nanotube nanocomposites via liquid deposition modeling', Composites Part A: Applied Science and Manufacturing, 2015, 76, pp. 110-114). It was found that conductive composites with low percolation threshold may be made with CNTs and graphene due to their 1D and 2D structures (Wei, X., Li, D., Jiang, W., Gu, Z., Wang, X., Zhang, Z., and Sun, Z.: '3D printable graphene composite', Scientific reports, 2015, 5, pp. 11181 and Postiglione, G., Natale, G., Griffini, G., Levi, M., and Turri, S.: 'Conductive 3D microstructures by direct 3D printing of polymer/carbon nanotube nanocomposites via liquid deposition modeling', Composites Part A: Applied Science and Manufacturing, 2015, 76, pp. 110-114).

This part of the project focuses on elucidating the effects of the conducting filament type on the quality of the subsequently electroplated copper and the electroplating rate that may be achieved. Due to the difference in the structure of nano-particles in various conducting filaments, it is expected to get different electroplating rates and adhesion strengths. Commercially available conductive filaments (both ABS and PLA types) were initially used with different types of fillers (in example, carbon black, CNT, graphite, and graphene). Also, recipes for making novel conductive filaments with exceptional conductivity are considered (Zhang, D., Chi, B., Li, B., Gao, Z., Du, Y., Guo, J., and Wei, J.: 'Fabrication of highly conductive graphene flexible circuits by 3D printing', Synthetic Metals, 2016, 217, pp. 79-86 and Kalsoom, U., Nesterenko, P. N., and Paull, B.: 'Recent developments in 3D printable composite materials', RSC Advances, 2016, 6, (65), pp. 60355-60371). The filaments are used for printing samples with ~10 mm long conductive tracks on an ABS or PLA printed support structure. Using an O-ring, a small electrochemical bath is made to grow copper on the samples with both galvanostatic and HEA electroplating methods. The electroplating duration is changed to generate copper films with thicknesses being between 1 μm and 35 μm (typical copper thickness in FR-4). The conductivity of the tracks before and after copper electroplating is measured for each sample using the 4-probe technique. The thickness and morphology of the grown copper layers is studied using atomic force microscopy (AFM). Also, the interface structure of the sandwiched copper-conductive carbon layers is investigated with cross sectional SEM.

Figure 8A:
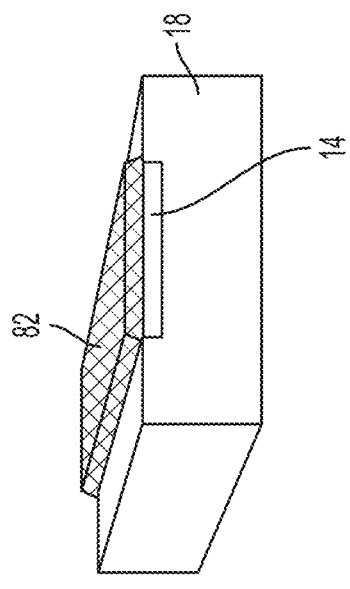
FIG. 8A schematically illustrates a first configuration for copper plating over printed carbon based tracks.
Figure 8B:
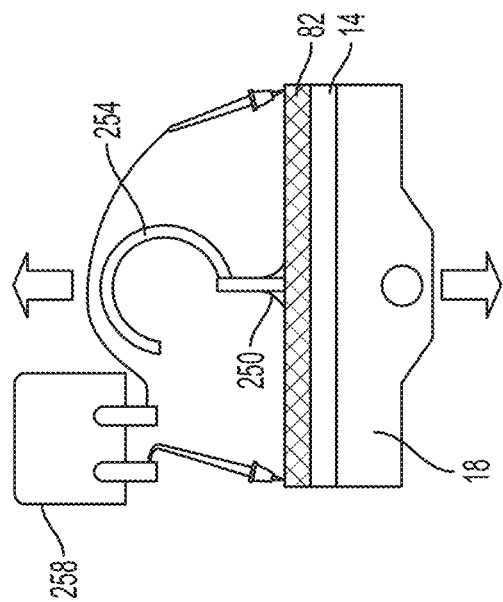
FIG. 8B schematically illustrates a second configuration for copper plating over printed carbon based tracks.
Figure 8C:
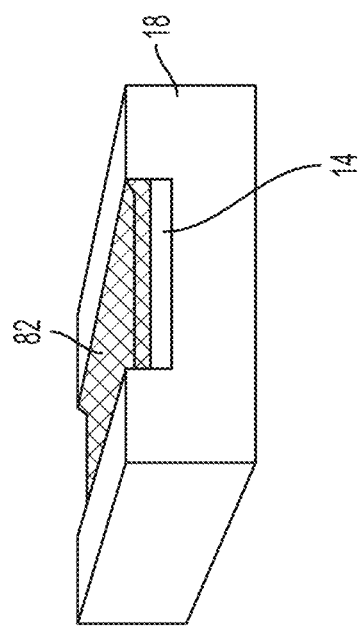
FIG. 8C schematically illustrates a third configuration for copper plating over printed carbon based tracks.

Due to the unique capabilities of 3D printing technology, there are different ways to print carbon based conductive materials on a 3D printed structure: a) inside a deep trench, b) inside a shallow trench to get a flat surface, and c) on top of a flat surface. As shown in FIGS. 8A-8C, the structure of the electroplated copper on each configuration is expected to be different, regarding the interface of the layers at the sides of the tracks. Consequently, the adhesion of the copper layer to each of the structures may be different.

Figure 8D:
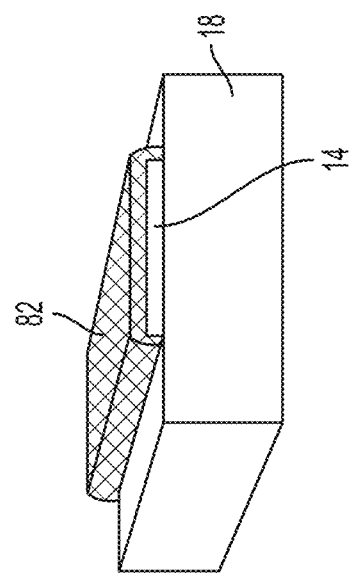
FIG. 8D schematically illustrates a system for measuring copper adhesion to printed carbon based tracks.

The adhesion between the electroplated copper and the conductive layer is measured using a digital force tester (a stress-strain measurement setup), as illustrated in FIG. 8D. Using a cyanoacrylate 250 (e.g., super glue) or other strong quick-setting adhesive, a hook 254 is attached to the copper layer 82 for testing, as seen in FIG. 8D. The force-displacement data reveals the adhesion strength. The setup is equipped with a resistance measurement (e.g., via an ohm meter 258) to probe the conductivity of the copper layer under tensile forces. With this method, any damage to the copper structure 82 may be detected, while applying defined force. Additionally, the mechanical strength of the multilayer structure may be tested via thermal expansion measurements. Copper is a metal with a linear thermal expansion coefficient of $1.7 \times 10^{-5}$ C-1 (Cardarelli, F.: 'Materials handbook: a concise desktop reference' (Springer Science & Business Media, 2008)). The corresponding expansion coefficients of ABS and PLA are $8.5 \times 10^{-5}$ C-1, and $19.6 \times 10^{-5}$ C-1 (Kantaros, A., and Karalekas, D.: 'Fiber Bragg grating based investigation of residual strains in ABS parts fabricated by fused deposition modeling process', Materials & Design, 2013, 50, pp. 44-50 and Chang, F.-Y., Teng, P.-T., and Tsai, T.-H.: 'Property measurement and processing parameter optimization for polylactide micro structure fabrication by thermal imprint', Japanese Journal of Applied Physics, 2013, 52, (6S), pp. 06GJ09). This means that during heat exposure, the substrate 18 expands more that may result in damaging the structure 82 by developing cracks on the copper layer 82 and/or delamination of the film. Considering the low melting point of the plastic 18, the experiment is performed in a limited temperature range (below 120° C.). The resistance along the copper track is monitored during the experiments. Also, formation of any possibly occurring micro cracks or copper delamination may be probed with an optical microscope.

Figure 9A:
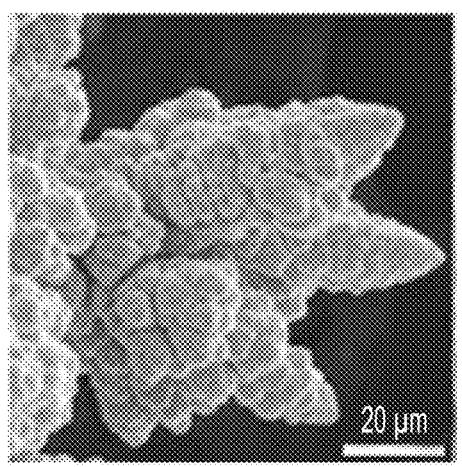
FIG. 9A illustrates a copper micro/nano structure grown at a first overpotential and electrolyte pH.
Figure 9B:
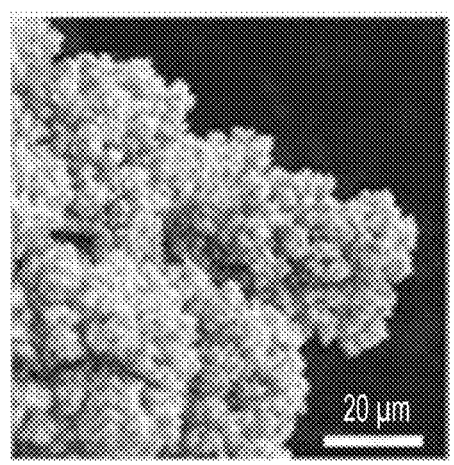
FIG. 9B illustrates a copper micro/nano structure grown at a second overpotential and electrolyte pH.
Figure 9C:
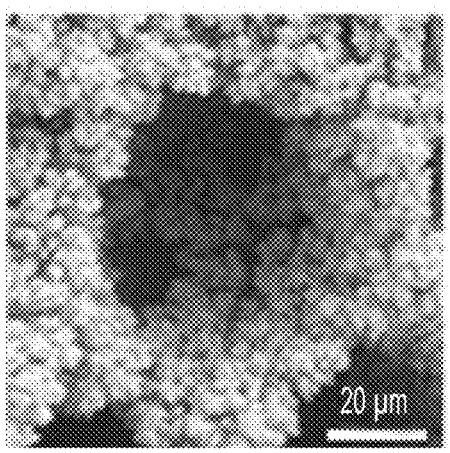
FIG. 9C illustrates a copper micro/nano structure grown at a third overpotential and electrolyte pH.

Effect of the electroplating conditions on the quality of the copper layer: The structure of electroplated copper films varies with the electroplating conditions. Nikolic et al., have shown that pH of the electrolyte (in example, H2SO4 concentration) and the overpotential value may significantly affect the nanostructure of HEA grown copper on a bulk piece (Nikolić, N., Branković, G., Pavlović, M., and Popov, K.: 'The effect of hydrogen co-deposition on the morphology of copper electrodeposits. II. Correlation between the properties of electrolytic solutions and the quantity of evolved hydrogen', Journal of Electroanalytical Chemistry, 2008, 621, (1), pp. 13-21 and Nikolić, N., Popov, K., Pavlović, L. J., and Pavlović, M.: 'The effect of hydrogen codeposition on the morphology of copper electrodeposits. I. The concept of effective overpotential', Journal of Electroanalytical Chemistry, 2006, 588, (1), pp. 88-98). A few of the nano/micro-structures are shown in FIGS. 9A-9C. Furthermore, application of a small voltage difference across the carbon printed track (as illustrated in FIG. 4B) increases lateral copper growth (printing speed). In this task, the effect of pH, overpotential, and the lateral voltage difference on the structure of electroplated copper coating and the lateral growth speed are studied. Some electrolyte additives, such as chloride and polyethylene glycol, which are proven to be effective for enhancing the adhesion of the electroplated copper, are considered as well (Miura, S., and Honma, H.: 'Advanced copper electroplating for application of electronics', Surface and Coatings Technology, 2003, 169, pp. 91-95). Electrical conductivity and adhesion strength of various samples grown under different conditions are measured using the 4-probe method and the stress-strain measurement setup (as illustrated in FIG. 8D).

The thickness/growth rate, morphology, and nano-structure of the HEA electroplated layers are studied using optical microscopy, AFM, and SEM, respectively. Apparently, by controlling the growth conditions, it is possible to produce a specific dendrite structure, as illustrated in FIGS. 9A-9C. Should the experimental results demonstrate poor adhesion, a stronger bond between copper and support structures may be induced by diffusing copper into the substrate structure. In this case, before electroplating, the surface of the printed structure may be treated with sulphuric acid to generate nano/micro pores (activation method) (Equbal, A., and Sood, A. K.: 'Investigations on metallization in FDM build ABS part using electroless deposition method', Journal of Manufacturing Processes, 2015, 19, pp. 22-31). Growing dendrites inside the pores may enhance the adhesion between the layers. The copper penetration into the pores is studied using SEM.

Laterally resolved HEA electroplating is studied in depth through the performance of electrochemical impedance spectroscopy (EIS) and cyclic voltammetry (CV) to find the reaction rates at different overpotential values. Further measurements are conducted to study the porosity of the copper layer using the CV method in a 3-probe electrochemical bath with a buffer electrolyte.

Higher printing speed is expected to produce copper layers with reduced adhesion. The use of time varied electroplating voltages is investigated, which allows the formation of a high-adhesion seed layer followed by a fast growth step to build up the bulk of the coating. This approach may be addressed as described below, by designing a control system to alternate the voltage in a periodic fashion.

Investigation of the electrochemical soldering process: The goal here is reducing the soldering time to less than 20 seconds, the contact resistance lower than 1Ω, and a reliable mechanical strength.

Since 3D printing of electronic components (for example, chips) is in its very early stages at this point (Gamota, D. R., Brazis, P., Kalyanasundaram, K., and Zhang, J.: 'Printed organic and molecular electronics' (Springer Science & Business Media, 2013)), printed circuits are most feasible when integrating standard electronic components with 3D printed structures. Electronic components are physically attached to a PCB through the solder joints at their terminals. Therefore, to print a circuit, first, the PCB layout 6 has to be printed with ABS/PLA and carbon based filaments 18, 14. Then the standard electronic components 90 are placed in their designated "cavities" followed by the electroplating step. For multilayer PCBs 6, the sequence would include printing the bottom layer, electroplating the tracks 14 on the bottom layer, printing a layer of the plastic 18 with the vias, printing the top layout, placing the components 90, and then electroplating the top tracks/vias 14 and soldering the components 90.

Figure 10A:
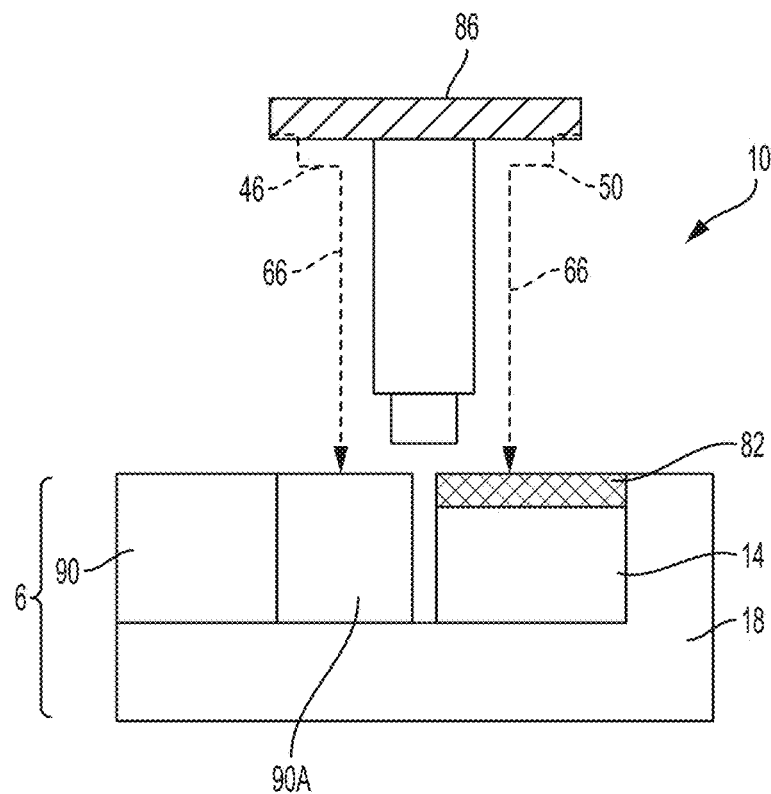
FIG. 10A schematically illustrates a first nozzle position for electrochemical soldering.
Figure 10B:
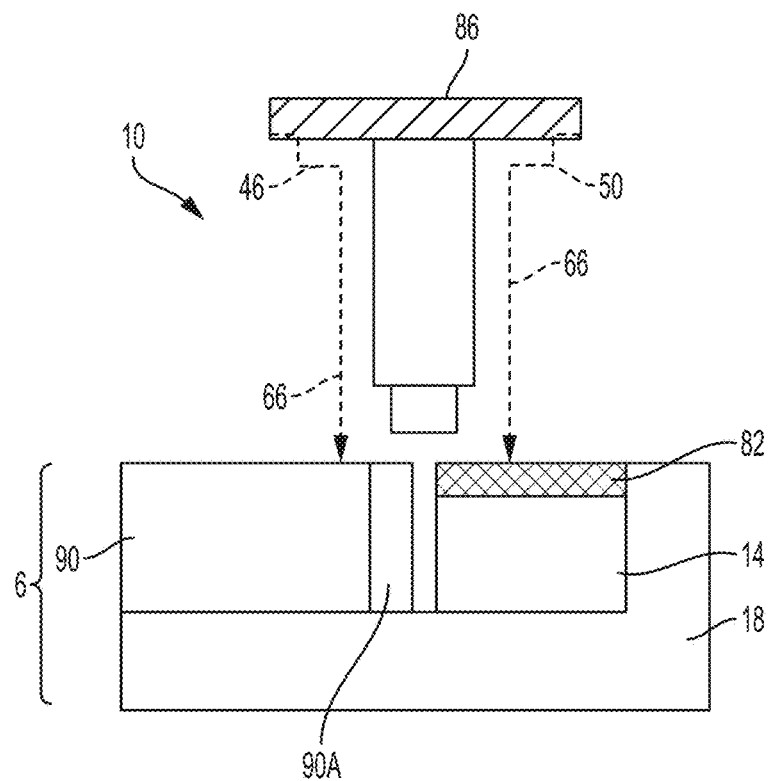
FIG. 10B schematically illustrates a second nozzle position for electrochemical soldering.

In this process, when the nozzle 10 is electroplating copper on a conductive track 14, it reaches to the end of the track 14 where the component 90 is located and soldering is required to make contact. FIGS. 10A and 10B illustrate two principal approaches to achieve a solder connection. The first method, simultaneous growth of copper from both the PCB side (in example, copper track 82) and the device terminal 90A is practiced (dual cathode configuration), as illustrated in FIG. 10A. In the second method, the focus is on growing copper only from the PCB side to reach the device terminal 90A (single cathode configuration), as illustrated in FIG. 10B.

Since the joint holds the component 90 in place while also connecting it, both electrical contact resistance and mechanical strength of a solder joint are important. In the research described herein, the focus is on the investigation of the dependence of the strength of HEA electroplated solder joints on different deposition conditions. The deposition voltage and electrolyte composition is systematically varied to find optimum conditions for highly conductive and at the same time strong joints. Additionally, reduction of the soldering time is considered in the optimum condition.

Figure 11:
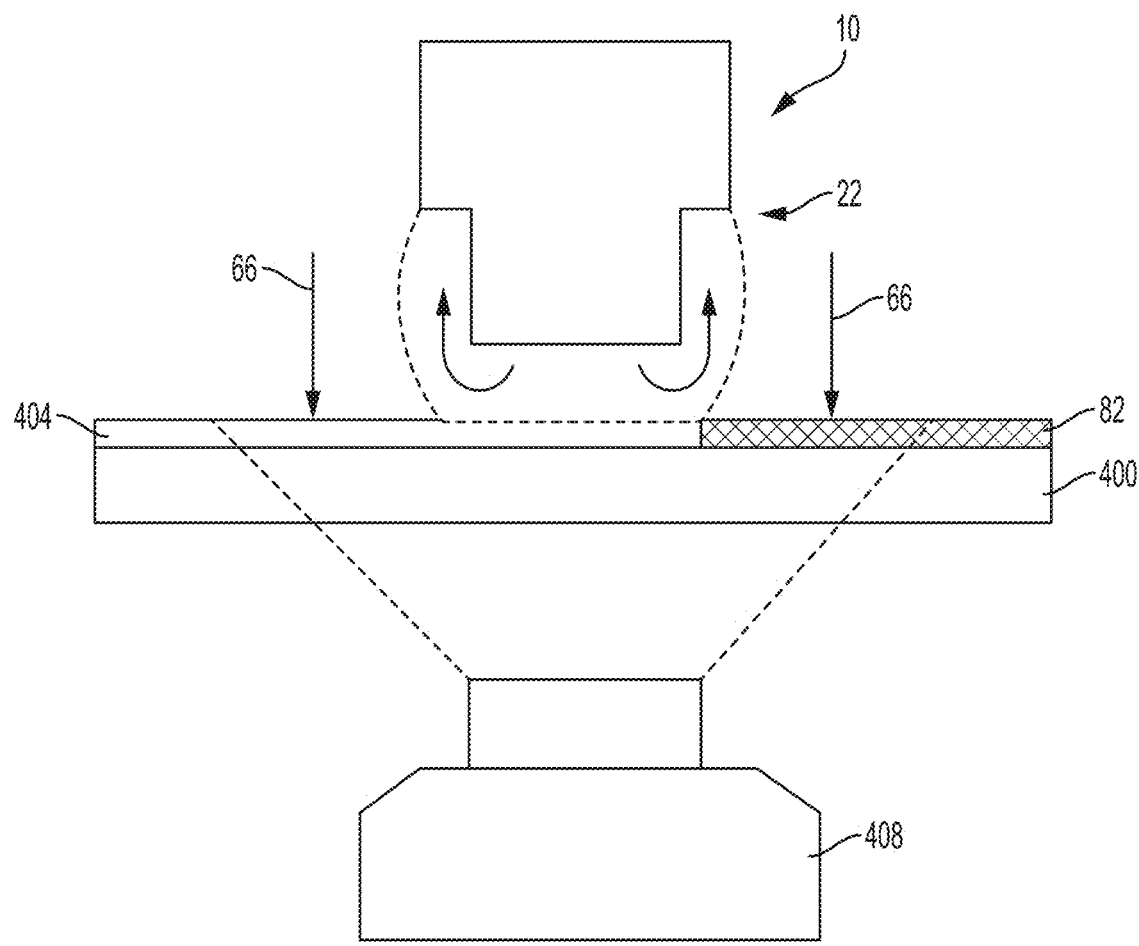
FIG. 11 schematically illustrates a test setup for studying localized electroplating with the devised nozzle structure.

Dual cathode soldering configuration: Preliminary experiments with an electric field between the two cathodes 46, 50 yielded significant lateral growth rate increases. In experiments, two slightly different voltages (ΔV=0.1 V) were applied to the cathodes 46, 50. Despite the small voltage difference, as expected, the growth rate was higher at the cathode with the larger absolute voltage. This resulted in a non-symmetrical growth of copper at the two sides (as illustrated in FIG. 6. Applying a small superimposed AC signal to one of the cathodes (~0.1 V) while the DC voltage of the both cathodes 46, 50 is −1.2 V versus the anode 38 is explored. The hypothesis is that the AC potential equalizes the growth rates on both sides of the gap. The effect of the magnitude of the voltages and the frequency of the AC signal is studied by monitoring the copper growth process using an optical microscope equipped with a digital camera 408 (FIG. 11).

One concern with this approach is that the AC voltage may short out when the gap is bridged. Since at this point the joint is still weak and further deposition is needed to strengthen it, a microcontroller based process to control the AC and DC voltages is devised. Monitoring of the AC current allows the detection when the gap was bridged successfully. At that point the controller shuts down the AC potential while continuing the DC deposition process between the anode 38 and the bridged gap between the trace 14 and component 90. Further monitoring of the deposition current between the two cathode pins 46, 50 allows auto-detection of the time when the solder joint has a low enough resistance to make good contact (close loop process).

Single cathode soldering configuration: Although for certain types of components with very narrow terminals, it might not be possible to use the dual cathode configuration (as illustrated in FIG. 10B), it is feasible to grow copper from the trace to reach the component terminal with just a single electrode (as illustrated in FIGS. 7A-7D). However, in the absence of a current based feedback mechanism, the deposition is an open loop process where the end of the deposition needs to be determined based on deposition time alone. A detailed study is carried out to find the relationship between overpotential, gap distance, and electroplating time. This allows predicting an appropriate deposition time. The quality of the resulting copper deposits at the soldering points is studied by SEM and resistance measurement.

A mechanical vibrator stage is used to evaluate the mechanical stability of solder joints made by both single and double cathode methods. In this approach, the resistance of the joint is recorded while the structure is under vibration at different amplitudes and frequencies. Also, different component topologies relative to the conductive traces 14, 82 are investigated, including conventional arrangements where the components 90 sit on top of the traces 14, 82 and the configuration with designs where the components 90 are positioned in cavities below the trace level (as illustrated in FIG. 5C). The amount of deposited metal 82 is relatively limited in electroplated joints compared to "normal" solder joints.

Printing a sturdy solder joint in less than 20 seconds provides a challenge. Considering that the nozzle 10 is in constant movement during the track metallization and it should pause (for a certain time) above the gap for soldering, an algorithm to control the nozzle motion to slow down before reaching the gap is considered. This allows the growth of a thicker layer of copper near the gap to ensure a stronger solder joint.

Study localized electroplating and design the electroplating nozzle system: The goal here is designing a nozzle structure for localized electroplating in an area with less than 0.8 mm in diameter.

This is mainly focused on designing the nozzle and the control system, which enables studying the HEA electroplating process under constant circulation of the electrolyte at the nozzle tip.

Nozzle design: In the preliminary experiments (and for studies described above), an O-ring is used to make a small laterally confined electrochemical "bath" on top of the sample. This approach is not practical for making an electroplating nozzle which has to be able to move over the surface. A common approach for "dry electroplating" is brush plating (Raja, S.: 'The systematic development of Direct Write (DW) technology for the fabrication of printed antennas for the aerospace and defence industry', Doctoral Dissertation, Mechanical, Electrical and Manufacturing Engineering, Loughborough University, 2014; Wang, W., Liu, X., and Shi, Z.: 'Mechanisms and influences of electrobrush plating micro-force on coatings performances', Journal of Materials Research, 2016, 31, (15), pp. 2337-2346; and Hu, K., Xu, Q. X., and Yang, X. L.: 'Fabrication of superhydrophobic surfaces on copper substrates via brush plating technique', Advanced Materials Research, 2014, 834, pp. 662-669), in which a compressed and porous fabric, such as felt, may be used at the tip of a marker-like nozzle. The fabric is kept wet through a wick connection to the electrolyte reservoir with the anode contact. Placing the tip on a track, the electrochemical interface is limited to the contact point. Despite the simplicity, brush plating requires constant maintaining services, due to the short lifetime of the tip. Because of the friction between the marker tip and the surface when the nozzle is moved over the surface, the tip is abraded quickly (Guojun, W., and Qunjia, C. Y. P.: 'Study on Friction and Wear Properties of Carbon Fiber Felt Copper Composites', Acta Materiae Compositae Sinica, 1997, 2, pp. 1-7). A more serious problem, occurring shortly after starting the copper deposition, is the growth of copper on the marker tip which requires frequent change of the tip to preserve the quality of the deposition.

Accordingly, embodiments described herein include using a nozzle 10 with two tubes 26, 30 in a coaxial arrangement to circumvent the above issues. As explained above, the inner tube 26 is connected to a reservoir 34 containing the electrolyte and the anode electrode 38. The outer tube 30 is evacuated by a small scroll pump 42 for cycling the electrolyte back to the reservoir 34. The negative pressure generated by the scroll pump 42, the liquid pressure at the tip 22 of the nozzle 10, and the distance between the nozzle tip 22 and the workpiece 6 are all important for efficient circulation of the electrolyte. Also, to confine the printing area to 0.8 mm in diameter, the diameter of the tubes 26, 30, the surface tension of the electrolyte, and the hydrophobicity of the substrate 18 should be considered. Using COMSOL simulation software, the direction of the fluid circulation at the tip 22 of the nozzle 10 is simulated for various tube sizes and pressure levels. The most promising combination is fabricated and tested on a custom made setup that is assembled using micrometers and an optical table. Prototypes are first made with plastic tubes and tested on a glass substrate 400 for measuring the diameter of the electrolyte-substrate interface as illustrated in FIG. 11. The pressures and the distance between the nozzle 10 and the substrate 400 are set to yield ~0.8 mm diameter of wetted surface. The approach may also be used to investigate the effect of localized HEA electroplating. A transparent layer of indium tin oxide (ITO) 404 on a glass substrate 400 may be patterned appropriately for use in these experiments. The process of both electroplating over a conductive ITO track 404 and across a gap (electrochemical soldering) may be mimicked on a glass substrate 400 instead of a 3D printed substrate 18. The required adjustment is applied in the electroplating process before fabricating a metallic nozzle structure 10 using stainless steel tubes. Fine-tuning of the pressures and nozzle-sample distance are performed during testing of the final stainless steel nozzle design 10 on 3D printed substrates 18. Also, four conductive pins 66, equipped with a spring mechanism 70 (as illustrated in FIG. 1), are added to the design. Using small springs 70 and mechanical pencil leads 66, a brush-commutator type of contact is implemented for soft and reliable electric contacts to the tracks 14 (as illustrated in FIG. 1).

Control system: Once the electroplating parameters are found, a microprocessor based circuit is designed to control the voltages (both AC and DC) for the anode and both cathodes. The current monitoring between the two cathode contacts and the feedback loops is considered in the circuit design. The processor 86 is programmed for different operational modes including single and double cathode soldering (as illustrated in FIGS. 10A and 10B); and one and two pin contacts configurations for electroplating (as illustrated in FIGS. 4A and 4B). The designed nozzle 10 is installed on an open frame FDM printer platform for controlling the position and scan rate of the nozzle 10 over 3D printed samples.

The liquid flow at the nozzle tip 22 has to be slow enough to not act as a water jet that could damage the copper layer. The electrolyte flow rate and direction are studied in the simulation. Simulating various designs, adequate curvatures are made at the rim of the tubes 26, 30 for soft fluid circulation.

Modeling and simulation: The goal here is theoretical and numerical analyses of the localized HEA and the process optimization.

Although copper electroplating has been studied for many years, localized HEA electroplating has not been investigated theoretically before. Due to the concurrent reactions of hydrogen evolution and reduction of copper ions at the cathode, only part of the electric current participates in the copper electroplating process. To find the rate of copper electroplating, the concentration profile of Cu2+ ions, [Cu2+], in the space from the bulk of the electrolyte to the surface of the cathode needs to be considered. Determination of the ion diffusion rate for a non HEA process is as simple as solving the diffusion equation:

$$\frac{\partial [Cu^{2+}]}{\partial t} = D \frac{\partial^2 [Cu^{2+}]}{\partial x^2} \qquad \text{Equation (2)}$$

where [Cu2+] is a function of time, t, and distance, x, from the surface of the cathode and D is the diffusion coefficient. However, the situation is different when hydrogen evolution assists convection of the Cu2+ ions toward the cathode. In this case, a first order differential equation, describing the convection process should be considered as well as Equation (2) (Bard, A. J., and Faulkner, L. R.: 'Electrochemical Methods Fundamentals and Applications', John Wiley, New York, 2001). A secondary convection process due to the circulation of the electrolyte at the nozzle tip also needs to be added to the model for a detailed process analysis. The electroplating process in a confined space defines the boundary conditions for solving the differential equations.

For electroplating copper on a resistive printed track, the voltage profile at the cathode has to be included in the model. In the electrochemical soldering approach that uses the dual cathode configuration, the electric field between the two electrodes results in a migration of ions and adds another dimension to the space for solving the differential equations for x and y directions (x perpendicular to the electrode and y the electric field direction parallel to the tracks) (Bard, A. J., and Faulkner, L. R.: 'Electrochemical Methods Fundamentals and Applications', John Wiley, New York, 2001). The plan is to first develop an analytical model for the process that includes all the features of the proposed localized HEA electroplating method. Based on this model, the differential equations related to diffusion, convection, and migration of the ions in the system are solved to obtain a map of the ions concentration, electrochemical potential, and the electric field in space. For numerical analyses, a multi-physics software package (in example, COMSOL) is used. The results of these investigations are expected to reveal the limiting factors slowing the chemical reactions. This helps to modify the design for enhancing the copper growth rate for faster printing speed as described above.

Broader Impacts

The research described herein impacts several areas, such as nanotechnology, electrochemistry, and 3D printing. The outcomes of the proposed research have impacts in fields ranging from material processing and characterization to system development for prototyping 3D electronics. The experimental and theoretical study of the HEA electroplating process has the potential to transform multi-material 3D printing technology, which will be the cornerstone of custom manufacturing in fields like advanced robotics, active medical implants or wearable and flexible/stretchable electronics.

One long-term goal of this project is the development of advanced multi-material 3D printing technology that have a wide range of applications. Most advanced hardware is composed of mechanical and electronic components that are tightly integrated. Examples where such integration is key are medical or military technologies where versatility, miniaturization, portability, and multi-functionality are major requirements. Such hybrid "mechatronic" systems are the future in many technological areas. The ability to directly integrate electronics with plastic support structures under direct CAD control is a major step towards the goal of manufacturing systems that can generate such advanced structures in a "one step" manufacturing approach.

Copper growth for the development of electroplating technique as a low-temperature soldering procedure represents a useful method for the formation of metal deposits, allowing modification of the thickness and morphology of the soldering joints. The approach is particularly useful for soldering electronic components to a plastic 3D printed substrate. To accelerate the soldering process hydrogen assisted electroplating (HAE) method was employed at room temperature. The experiments were designed by making a small electrochemical cell around the gap on a printed circuit board (PCB) or a 3D printed conductive track. During the experiment, water electrolysis was observed, which released hydrogen bubbles. The hydrogen bubbles caused the structure of the electroplated layer to be more porous, but with a similar conductivity as solid copper and a remarkable mechanical strength suitable for use as interconnects on an electronic circuit. The electrochemical data and video recorded images show a fast and reliable copper electrodeposition in less than 1 minute. The morphology of copper deposits on a 3D printed structure was studied with the scanning electron microscopy (SEM). A reliable soldering process was demonstrated for a surface mount light emitting diode (LED) on a PCB. Further experiments are required to optimize the soldering process for faster and more reliable electroplating, particularly for 3D printed substrates.

Technology is in the need of improvement in order to develop new devices and enhance procedures. With the recent development in 3D printings, fast and in-house prototyping of mechanical structures has become feasible (J. Ainsworth, D. Disher, and D. Morreal (2015)). However, electronic circuit's prototyping is still required advanced facilities for lithography of PCBs and automated pick-and-place machines for soldering surface mount electronic components. Several approaches have been demonstrated before for using a printing technique for prototyping electronic circuits (E. A. Rojas-Nastrucci, A. D. Snider, and T. M. Weller. IEEE Transactions on Microwave Theory and Techniques, 64(11): p. 3460-3468. (2016); and S. Ready, F. Endicott, G. L. Whiting, T. N. Ng, E. M. Chow and J. P. Lu. NIP & Digital Fabrication Conference. (2013)). The most common method is the inkjet printing for making a PCB using conductive inks made of silver or copper nanoparticles (H. H. Lee, K. S. Chou and K. C. Huang. Nanotechnology, 16(10), p. 2436-2441.(2005)). After printing, the substrate has to be heated up to remove the solvents and melt the nanoparticles to form continuous conductive tracks. The approach has several technical challenges which limit its application to only simple circuits. For instance, the substrate has to be flat and smooth and being made of materials with high melting temperatures. Majority of 3D printing methods use plastics with low melting temperatures for building the mechanical structures. To integrate an electrical/electronic circuit to a 3D printed structure, other methods have been developed. For example, in Fused Deposition Modeling (FDM) plastic filaments with carbon fillers have been used for printing simple circuits (S. J. Leigh, R. J. Bradley, C. P. Pursell, D. R. Billson and D. A. Hutchins. J. Plos One, 7(11).(2012)). In this method, a dual extrusion 3D printer can print both plastic (insulating material) and carbon reach (conductive) filaments to print a PCB layout. However, fabrication of an electronic circuit on a 3D printed circuit requires a reliable method of interconnecting the elements to the conductive tracks. Due to the low melting temperature of the plastics, conventional soldering method using a soldering iron is not practical. Hence, conductive pastes have been the only option which is not as reliable as conventional soldering materials, due to their lower conductivity and adhesion. To overcome the problems for integrating electronics to a 3D printed structure the feasibility of using copper electroplating for soldering electronic components to conductive tracks at room temperature has been studied. Although the method is potentially practical, the low deposition rate of copper is a major drawback. In this work, the hydrogen evolution assisted (HEA) electroplating (N. D. Nikolic, L. J. Pavlovic, M. G. Pavlovic, and K. I. Popov. Electrochimica Acta vol. 52 (2007), p. 8096-8104) is demonstrated as a rapid method of growing copper across a non-conductive gap for soldering surface-mount electronic elements, suitable for electrodes in many electrochemical devices, such as fuel cells, batteries and chemical sensors (S. Miura and H. Honma. Surface & Coating Technology, vol. 169-170, p. 91-95.(2013)). The experiments were conducted on both standard PCBs and 3D printed conductive tacks. The results show a promising approach for further development of the method for low-temperature soldering of electronic components.

EXAMPLE

The electrolyte for electroplating was prepared by making a solution of 0.4 M of CuSO4 (from Sigma) and 1.3 M of H2SO4 (from Sigma) in deionized (DI) water.

Figure 12A:
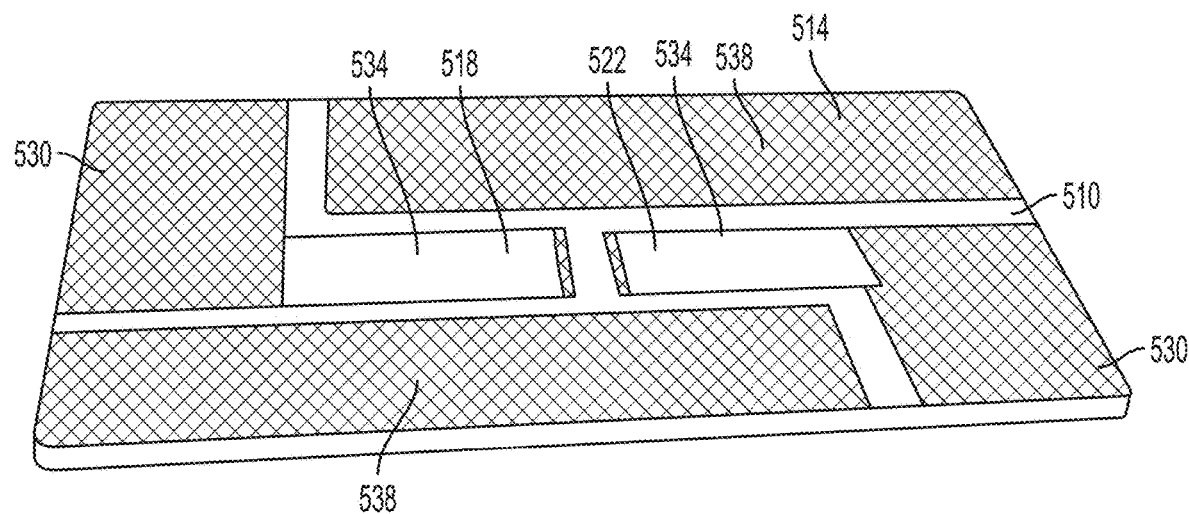
FIG. 12A illustrates a PCB used for HEA copper electroplating experiments.

For the experiments on a PCB board 510, first the pattern shown in FIG. 12A was applied on the copper side 514 of the PCB 510 using a permanent marker. The copper pattern was developed by etching the exposed copper in a ferric chloride solution (from MG Chemicals). The two tracks with 1 mm gap were used to mimic a gap between the terminal of an electronic component and the circuit layout. The objective was to bridge the gap using the electroplating method. An O-ring (similar to the O-ring 246 shown in FIG. 7D) is placed over the gap between the two tracks to build an electroplating bath. For testing the copper 514 bridging across the gap, the tracks 518, 522 were used as the first and second cathodes, each connected to a voltage source via the pads 530. Also, each track 518, 522 was covered with the permanent marker 534 except for a small part of the copper near the gap. The larger copper pad 538 (not covered by any layer) near the gap was used as the shared anode (the source of copper for electroplating). For the HEA soldering experiment, a surface-mount LED (similar to the LED 230 shown in FIGS. 7A-7D) is placed across the gap and only one cathode is used. The other terminal of LED is soldered to the second track 522 using a soldering iron.

Figure 12B:
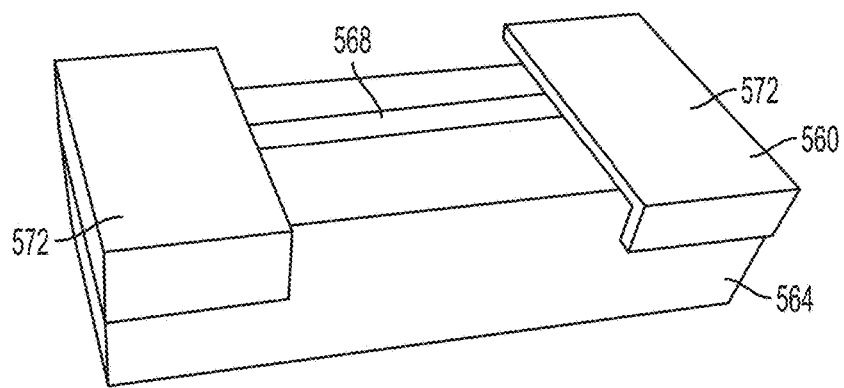
FIG. 12B illustrates a 3D printed pattern used for HEA copper electroplating experiments.

To test the feasibility of electroplating on a 3D printed structure, a conductive track 560 is printed on a plastic substrate 564 using an FDM printer (Replicator 2 from MarkerBot). Standard polylactic acid (PLA) filaments are used for printing the insulating part and Proto-pasta conductive filament is used for printing the conductive track. The conductive filament is a PLA based material with carbon fillers with the bulk resistivity of 15 Ω·cm. FIG. 12B shows a printed sample. The track 568 is 20 mm long and 2.5 mm wide with a resistance of several kΩ between the two pads 572 across the track 568. Again an O-ring (similar to the O-ring 246) is used to make the electroplating bath on the track 568. A piece of copper wire (not shown) is used as the anode.

In both setups, a microscope camera 408 is set above the sample to record the electroplating process. The O-ring area is filled with the electrolyte, and a Keithley 2602 dual channel source-measurement unit is used as the voltage sources and data logging system. The quality of the electroplated area is tested by resistance measurement and scanning electron microscopy (SEM) methods after the electroplating process.

Discussion

Using the patterned PCB in FIG. 12A, the electrochemical deposition is carried out by applying 0 V to the anode and −0.5 V to each cathode. While the recorded current shows an ongoing electroplating, the video recorded images do not show any visible change on the patterned copper even after several minutes of electroplating. The observation is in good agreement with the theory of the electroplating. The thickness of the electroplating layer, d, is a function of time, t, and the current density, J, through the Faraday equation (Bard, A. J., and Faulkner, L. R.: 'Electrochemical Methods Fundamentals and Applications'. (John Wiley Publishers, New York, 2001):

$$d = \frac{JM_w}{nAF\rho}t \qquad \text{Equation (1)}$$

where Mw is the atomic weight of copper (63.5 g/mol), F is the Faraday constant (~96485 C/mol), n is the change in the oxidation state (n=2 for Cu2+ to Cu), and ρ is the copper density (8.63 g/cm3). In the equation, the speed of growing copper (electroplating rate) can be calculated from J·Mw/n·F·ρ. A typical current density of 20 mA/cm2 implies ~7.6 nm/s rate (T. N. Kumar, M. Kulkarni, M. Ravuri, K. Elangovan and S. Kannan. J. Future Engineering and Technology, 10, (3), p. 29.(2015)). With such a rate, no visible change is expected even after several minutes of electroplating.

Figure 13:
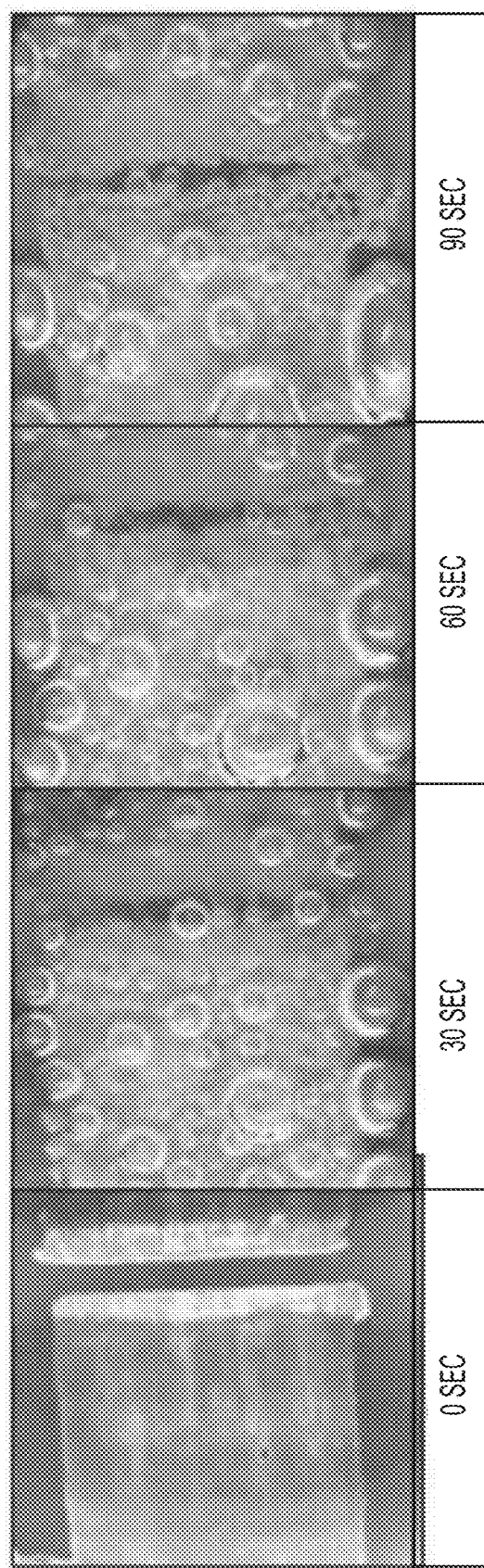
FIG. 13 shows the HEA electroplating process across a 1 millimeter gap on a PCB sample at various times.

To increase the electrodeposition speed, first, the electroplating process is tested at higher voltages up to ~0.8 V between the anode and each cathode. Although the current density can be enhanced at the elevated voltages, the deposition rate is increased by a few folds, still not making any visible change. However, for voltages above 1.0 V, hydrogen bubble release near the cathode due to the concurrent water hydrolysis and copper deposition. As shown in FIG. 13, for a case with −1.2V to the first cathode and −1.1V to the second cathode (with respect to the common anode at 0V), the hydrogen bubbles are released from the electroplated area. In many conventional applications such as jewelry electroplating, hydrogen evolution should be avoided (by limiting the voltage) for depositing a compact copper layer. However, the release of hydrogen bubbles can assist the electroplating process; hence, dramatically increasing the copper deposition rate. In fact, as shown in FIG. 13, the hydrogen evolution assisted (HEA) process results in a rapid growth of copper across the gap reaching a speed of ~33 μm/s. The high speed growth came with the cost of losing the compact structure and depositing a porous structure instead. The dramatic increase in the electroplating rate can be explained via Equation 1. The density, ρ, of a porous structure can be significantly lower than that in a compact layer, resulting in an increase of the electroplating rate (J·Mw/n·F·ρ) even for a limited current density.

Figure 14:
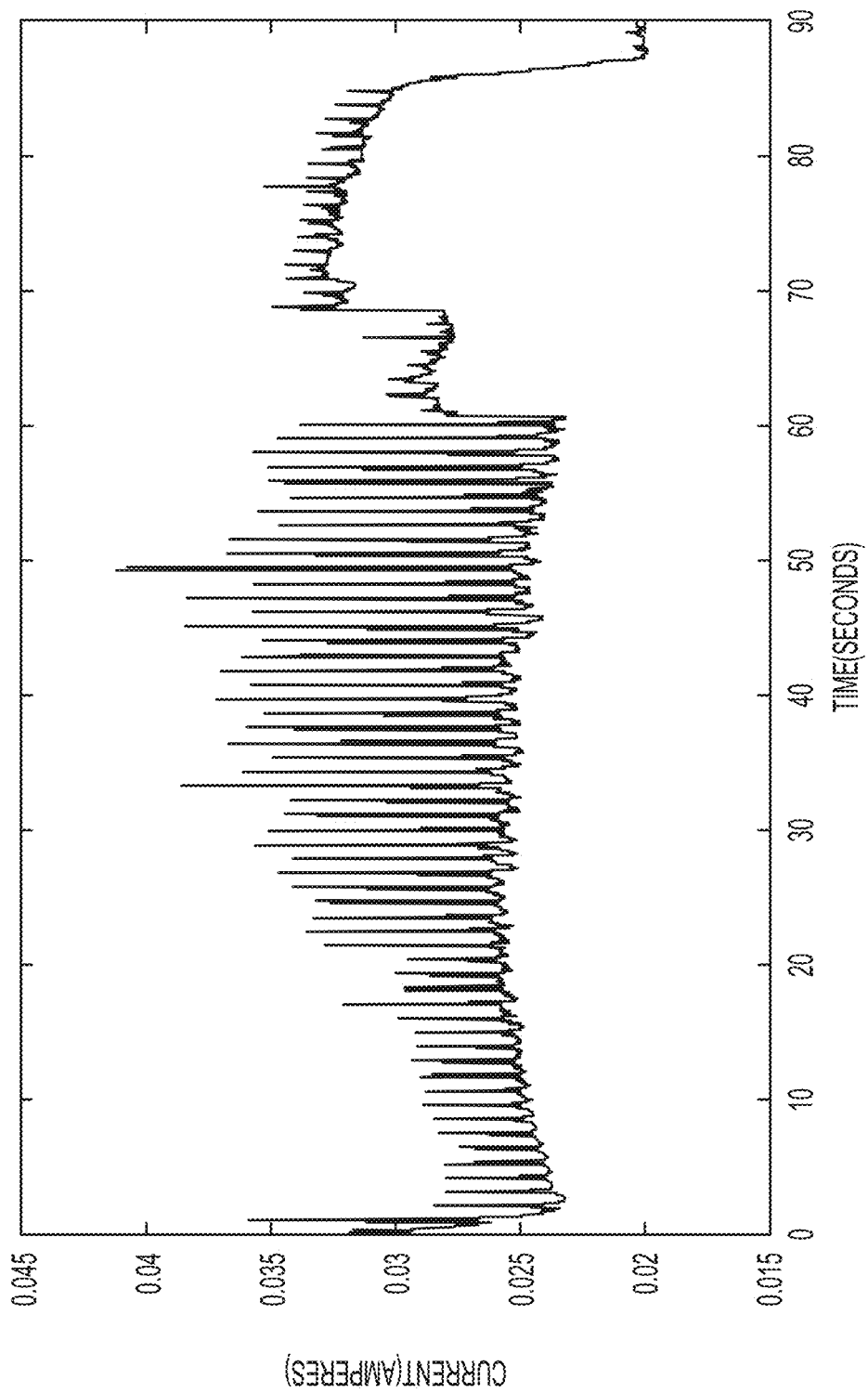
FIG. 14 graphically illustrates current versus time during the electroplating of the PCB sample.

The graph in FIG. 14 shows the recorded current density during the electrodeposition. The large fluctuation in the current is due to frequent hydrogen bubble release. Application of a voltage slightly different than the first cathode to the second cathode generates a lateral electric field across the gap which increases the lateral electroplating speed. The resistance across the bridged electroplated area is measured to be 13.1Ω.

Figure 15:
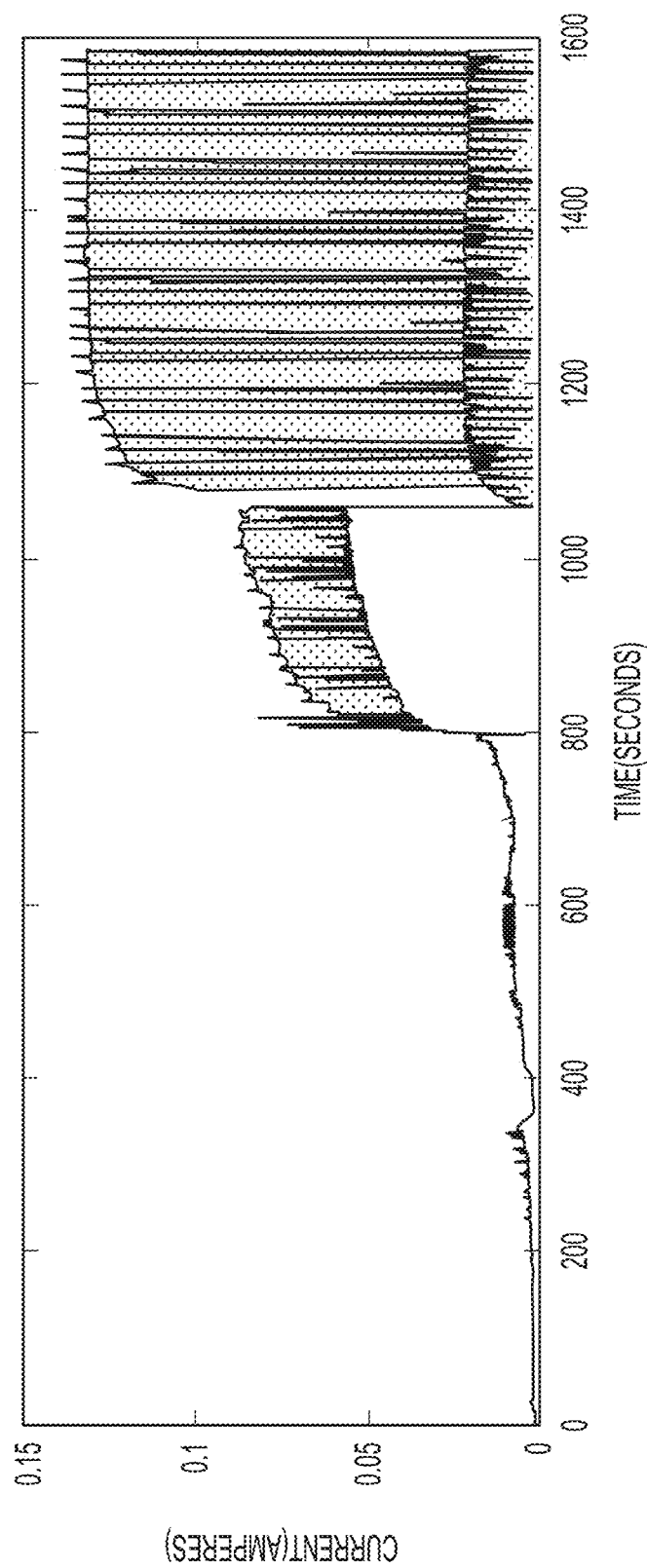
FIG. 15 graphically illustrates current versus time of the 3D printed sample
Figure 16A:
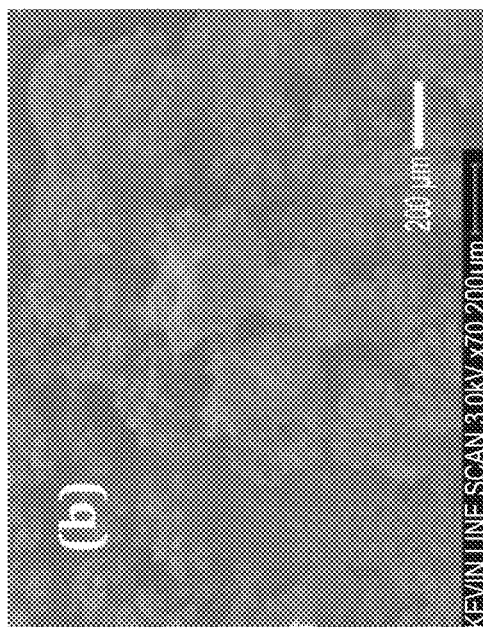
FIG. 16A is an SEM image of the 3D printed conductive track before the HEA electroplating.

The concept of the fast HEA electroplating is further practiced for copper deposition on the conductive 3D printed track in FIG. 12B. The carbon pad 572 is connected as the cathode with a voltage of −1.2 V with respect to the anode (0 V) which is a piece of copper wire in the electrolyte. Since the carbon based printed track 568 is very resistive, a voltage drop is expected between the contact point near the cathode and the electrochemical interface. The voltage drop results in a voltage difference less than 1.2 V between the anode and the surface of the cathode. This makes the electroplating process extremely slow in the beginning. FIG. 15 shows the recorded current during the electroplating of the track 568. The current showed some increases in the first 750 s of the experiment. During the initial electroplating process, a thin layer of copper is formed along the carbon track 568 which drops the resistance. Therefore, after 750 s, the current increased significantly. The large current fluctuation is an indication of hydrogen evolution. The hydrogen bubbles behave like a passivation layer on the cathode. As the hydrogen bubbles are formed and released the electrochemical interface between the copper and electrolyte experiences changes in the exposed surface area. Hence, the electroplating current is fluctuating. FIG. 16A shows the SEM image of the 3D printed conductive track before the electroplating.

Figure 16B:
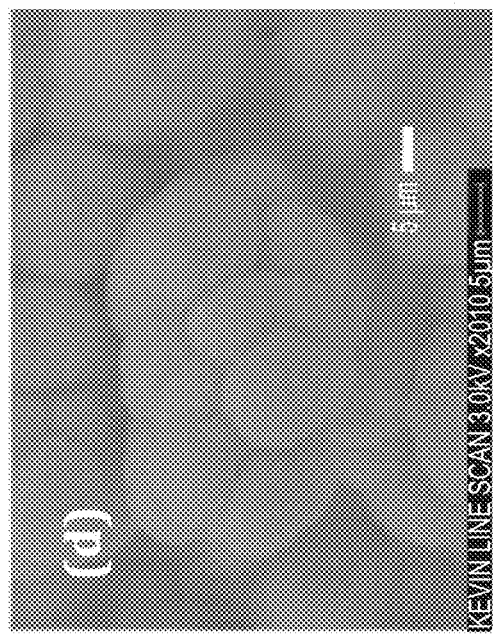
FIG. 16B is an SEM image of the 3D printed conductive track after the HEA electroplating, illustrating the porosity of the electroplated copper.
Figure 16C:
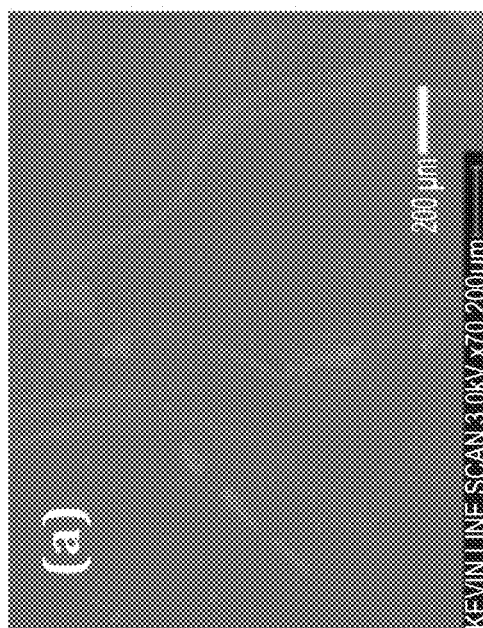
FIG. 16C is an SEM image of the 3D printed conductive track after the HEA electroplating, magnified relative to FIG. 16B.
Figure 16D:
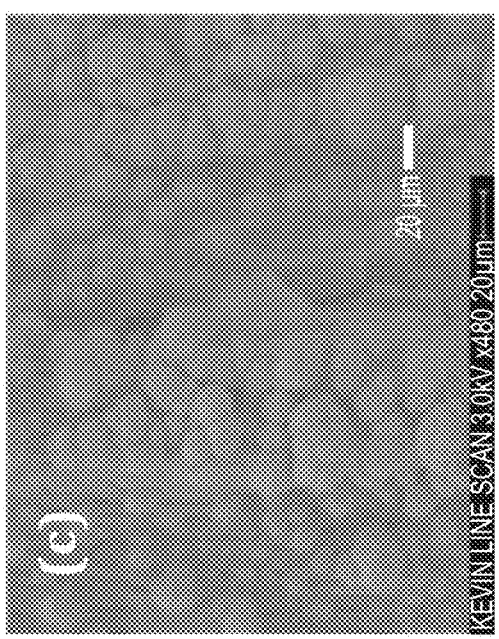
FIG. 16D is an SEM image of the 3D printed conductive track after the HEA electroplating, magnified relative to FIG. 16C, illustrating the copper nanostructure formed during the HEA electroplating.

FIGS. 16B-16D show the electroplated copper. The images clearly show the non-compact and porous structure of the deposited copper.

The concept of using HEA electroplating method for soldering an LED is also tested with a patterned PCB, as previously shown with respect to FIGS. 7A-7D. FIG. 7A shows the gap between the LED terminal and the copper track before the deposition. For the soldering process only one cathode (−1.2V) was used. Although the contact between the copper track and the LED terminal was made in about 30 s after starting the electroplating process, the experiment was conducted up to 55 s to make a reliable contact. The electroplated copper across the gap is shown in FIG. 7B. To study the effect of bubbles and the electrolyte on the functionality of the device, the LED was tested after removing the electrolyte (FIGS. 7C and 7D).

Soldering a component to a 3D printed structure requires further study of the voltage drop along the carbon based materials. Specifically, it is required to change the design of the 3D printed track to reduce the resistance of the 3D printed track. Nevertheless, the presented results are promising for development of the method for practical applications.

The electrodeposition conducted by single cathode terminal configuration at low voltages had a slow copper growth rate not suitable for printing a circuit layout or soldering. At high voltages, the hydrogen evolution effect was observed during the electrodeposition resulting in a dramatic increase of copper growth rate in the both PCB and 3D samples. The high growth rate was achieved due to the growth of more porous copper structure (because of the hydrogen bubbles) instead of a compact structure. Although the porous copper structure is not mechanically as strong as a compact layer, experiments are conducted to employ the dendrite morphology of the HEA plated copper for anchoring the electroplated coppers to the underlying layer, particularly to the 3D printed substrates. The significant advantage of the HEA electroplating method is in its fast growth rate that can be used in the future for developing a copper printing method. Printing copper facilitates electronic circuit prototyping and enables soldering the components while printing copper.

Thus, embodiments described herein relate to, among other things, electrochemical printing and low temperature soldering. Various features and advantages of the invention are set forth in the following claims.

What is claimed is:

1. A method of low-temperature soldering using a hydrogen evolution assisted electroplating nozzle, the method comprising:
    printing a conductive track on a substructure;
    placing a surface mount electronic device (SMD) having a terminal on the substructure;
    positioning a tip of the hydrogen evolution assisted electroplating nozzle at a predetermined distance above the substructure, wherein the predetermined distance ensures a contact pin connected to the electroplating nozzle makes slidable electrical contact with the conductive track, wherein the contact pin is adjacent to and spaced apart from the tip, and
    electroplating, with the hydrogen evolution assisted (HEA) electroplating nozzle, a metal between the conductive track and the terminal of the SMD by applying a predetermined voltage to grow the metal via hydrogen evolution assistance.

2. The method of claim 1, wherein the substructure is a 3D printed structure constructed by printing different layers on top of each other and comprising a filament material of acrylonitrile butadiene styrene (ABS) or polylactic acid (PLA).

3. The method of claim 1, wherein the contact pin is a first contact pin, the method further comprising making electrical contact between a second contact pin and the terminal of the SMD when applying the predetermined voltage.

4. The method of claim 1, wherein the substructure includes a cavity, and wherein placing the SMD on the structure includes placing the SMD within the cavity.

5. The method of claim 1, wherein the nozzle comprises:
    a reservoir at a proximal end of the nozzle, the reservoir containing an electrolyte, the reservoir further containing an anode in contact with the electrolyte in the reservoir;
    the tip at a distal end of the nozzle opposite the reservoir, the tip configured to interface with a portion of the substructure, the tip defined by distal ends of two coaxially aligned tubes comprising an inner coaxial tube within an outer coaxial tube, the distal end of the inner coaxial tube extending beyond the distal end of the outer coaxial tube;
    the inner coaxial tube connected at a proximal end of the reservoir and extending through the nozzle to the distal end defining the tip, the inner coaxial tube configured to dispense the electrolyte through the tip onto the portion of the substructure; and
    the outer coaxial tube encompassing the inner coaxial tube, the outer coaxial tube configured to extract the electrolyte from the portion of the substructure.

6. A method of low-temperature soldering using a hydrogen evolution assisted electroplating nozzle, the method comprising:
    printing a carbon-based conductive track on a substructure, the substructure having a melting point of below 120 degrees Celsius;
    placing a surface mount electronic device (SMD) having a terminal on the substructure;
    positioning a tip of the hydrogen evolution assisted electroplating nozzle at a predetermined distance above the substructure, wherein the predetermined distance ensures a contact pin connected to nozzle makes slidable electrical contact with the conductive track, wherein the contact pin is adjacent to and spaced apart from the tip, and
    electroplating, with the hydrogen evolution assisted (HEA) electroplating nozzle, a metal between the conductive track and the terminal of the SMD by applying a predetermined voltage to grow the metal using hydrogen evolution assistance.

7. The method of claim 6, wherein the metal is copper.

8. The method of claim 6, wherein applying the predetermined voltage to grow the metal on the conductive track includes applying the predetermined voltage between two contact pins of the hydrogen evolution assisted electroplating nozzle and generating a potential profile along the conductive track.

9. The method of claim 8, wherein generating the potential profile along the conductive track increases a growth rate of the metal on the conductive track.

10. The method of claim 6, wherein the metal creates a layer on the conductive track, the layer comprising different thicknesses of the metal at different points along the conductive track, such that a thickness of the layer grown as a soldering joint between the conductive track and the terminal of the SMD is greater than a thickness of the layer grown at other points along the conductive track.

11. The method of claim 6, where positioning the tip at the predetermined distance includes electrically contacting two pins of the hydrogen evolution assisted electroplating nozzle with the conductive track.

12. The method of claim 11, further comprising sensing a quality of an electroplated area based on a resistance between the two pins of the hydrogen evolution assisted electroplating nozzle.

13. The method of claim 12, further comprising adjusting a speed of movement of the hydrogen evolution assisted electroplating nozzle based on the sensed quality of the electroplated area.

14. The method of claim 13, further comprising adjusting a speed of movement of the hydrogen evolution assisted electroplating nozzle based on the sensed quality of a soldering joint.

* * * * *